(12) United States Patent
Inada et al.

(10) Patent No.: US 10,604,839 B2
(45) Date of Patent: Mar. 31, 2020

(54) SUBSTRATE PROCESSING APPARATUS, METHOD OF MANUFACTURING SEMICONDUCTOR DEVICE, AND METHOD OF PROCESSING SUBSTRATE

(71) Applicant: HITACHI KOKUSAI ELECTRIC INC., Tokyo (JP)

(72) Inventors: Tetsuaki Inada, Toyama (JP); Yuichi Wada, Toyama (JP); Mitsunori Ishisaka, Toyama (JP); Mitsuhiro Hirano, Toyama (JP); Sadayoshi Horii, Toyama (JP); Hideharu Itatani, Toyama (JP); Satoshi Takano, Toyama (JP); Motonari Takebayashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 527 days.

(21) Appl. No.: 14/826,756

(22) Filed: Aug. 14, 2015

(65) Prior Publication Data
US 2016/0053373 A1 Feb. 25, 2016

(30) Foreign Application Priority Data
Aug. 19, 2014 (JP) .................. 2014-166608

(51) Int. Cl.
*C23C 16/455* (2006.01)
*C23C 16/458* (2006.01)
(Continued)

(52) U.S. Cl.
CPC ........ *C23C 16/45551* (2013.01); *C23C 16/34* (2013.01); *C23C 16/4584* (2013.01);
(Continued)

(58) Field of Classification Search
USPC ................ 118/715–733; 156/345.33, 345.34
See application file for complete search history.

(56) References Cited

U.S. PATENT DOCUMENTS 5,950,925 A * 9/1999 Fukunaga ......... C23C 16/45512
118/715
9,267,204 B2 2/2016 Honma
(Continued)

FOREIGN PATENT DOCUMENTS

JP 2010-059499 3/2010
JP 2010-062370 3/2010
(Continued)

OTHER PUBLICATIONS

Office Action in JP counterpart application No. 2014-166608 dated Dec. 5, 2017.
(Continued)

*Primary Examiner* — Rakesh K Dhingra
(74) *Attorney, Agent, or Firm* — Volpe and Koenig, P.C.

(57) ABSTRACT

A substrate processing apparatus, including: a processing chamber having a first and a second processing regions; a substrate mounting table rotatably installed in the processing chamber on which a substrate is mounted, and a rotation instrument configured to rotate the substrate mounting table such that the substrate passes through the first processing region and the second processing region in this order, at least one of the first and the second processing regions including: a gas supply part including a line-shaped opening portion extending in a radial direction of the substrate mounting table and configured to supply a gas from the opening portion into the region; and a gap holding member protruding from a ceiling of the processing chamber opposing the substrate, around the opening portion, toward the substrate such that a space on the substrate has a predetermined gap to serve as a passage of the supplied gas.

8 Claims, 10 Drawing Sheets

(51) Int. Cl.
 *C23C 16/34* (2006.01)
 *H01L 21/285* (2006.01)
 *H01L 21/3205* (2006.01)

(52) U.S. Cl.
 CPC .. *C23C 16/45519* (2013.01); *C23C 16/45591* (2013.01); *H01L 21/28562* (2013.01); *H01L 21/32051* (2013.01)

(56) References Cited

U.S. PATENT DOCUMENTS

| | | | |
|---|---|---|---|
| 2003/0140851 A1* | 7/2003 | Janakiraman | C23C 16/455 118/715 |
| 2006/0086319 A1* | 4/2006 | Kasai | C23C 16/16 118/715 |
| 2008/0193643 A1* | 8/2008 | Dip | C23C 16/45508 427/255.5 |
| 2009/0148704 A1* | 6/2009 | Takasuka | C23C 16/4401 428/411.1 |
| 2009/0170334 A1 | 7/2009 | Fang et al. | |
| 2009/0239362 A1 | 9/2009 | Hirata et al. | |
| 2010/0003405 A1* | 1/2010 | Kappeler | C23C 16/45551 427/255.28 |
| 2010/0050943 A1 | 3/2010 | Kato et al. | |
| 2010/0055319 A1 | 3/2010 | Kato et al. | |
| 2010/0055320 A1* | 3/2010 | Honma | C23C 16/45544 427/255.28 |
| 2010/0116210 A1* | 5/2010 | Kato | C23C 16/45523 118/730 |
| 2010/0229797 A1 | 9/2010 | Kato et al. | |
| 2010/0310772 A1* | 12/2010 | Tsuda | C23C 16/409 427/255.28 |
| 2011/0146703 A1* | 6/2011 | Chen | C23C 16/0245 134/1.1 |
| 2011/0155056 A1 | 6/2011 | Kato et al. | |
| 2011/0212625 A1 | 9/2011 | Toyoda et al. | |
| 2011/0214611 A1 | 9/2011 | Fjerdingstad | |
| 2012/0152171 A1* | 6/2012 | Lee | C23C 16/45551 118/730 |
| 2013/0078823 A1 | 3/2013 | Takeshima et al. | |
| 2015/0279627 A1* | 10/2015 | Iwasaki | C23C 16/345 118/723 ME |

FOREIGN PATENT DOCUMENTS

| | | | |
|---|---|---|---|
| JP | 2010-219125 | | 9/2010 |
| JP | 2011-100956 | | 5/2011 |
| JP | 2011-134996 | | 7/2011 |
| JP | 2011-222960 A | | 11/2011 |
| JP | WO 2014/057836 | * | 4/2014 |
| KR | 10-2010-0028492 A | | 3/2010 |
| KR | 10-2011-0074714 A | | 12/2010 |
| KR | 10-2013-0033336 A | | 9/2012 |
| TW | 200945436 A1 | | 11/2009 |
| TW | 201005804 A1 | | 2/2010 |
| TW | 201024450 A1 | | 7/2010 |

OTHER PUBLICATIONS

Korean Office Action for Patent Application No. 10-2015-0111775 dated Jul. 22, 2017.
Korean Office Action dated Jan. 19, 2017 for Korean Patent Application No. 10-2015-0111775.
Taiwanese Office Action dated Sep. 29, 2016 for Taiwanese Patent Application No. 104123070 (8 pages).

* cited by examiner

SUBSTRATE PROCESSING APPARATUS, METHOD OF MANUFACTURING SEMICONDUCTOR DEVICE, AND METHOD OF PROCESSING SUBSTRATE

CROSS-REFERENCE TO RELATED APPLICATION

This application is based upon and claims the benefit of priority from Japanese Patent Application No. 2014-166608, filed on Aug. 19, 2014, the entire contents of which are incorporated herein by reference.

TECHNICAL FIELD

The present disclosure relates to a substrate processing apparatus, a method of manufacturing a semiconductor device, and a method of processing a substrate.

BACKGROUND

In the process of manufacturing a semiconductor device, a substrate, such as a wafer, is subjected to various kinds of processes. One example of such processes may include a process of forming a film using an alternate supplying method. The alternate supplying method used herein refers to a method of alternately supplying at least two kinds of process gases including a precursor gas and a reaction gas reacting with the precursor gas onto a substrate to be processed, forming layers one by one by reacting these gases on a surface of the substrate, and forming a film of a desired thickness by stacking each of the layers.

One type of substrate processing apparatus, which performs the process of forming the film using the alternate supplying method, may include the following configuration. This type of substrate processing apparatus may include a processing chamber partitioned into a first processing region having a first processing gas atmosphere, a second processing region having a second processing gas atmosphere, and a purge region interposed between the first and the second processing regions for separating these gas atmospheres from each other. A substrate mounting table is moved into the processing chamber and then, a substrate on the substrate mounting table is allowed to pass through each region so that a film forming process is performed on the substrate.

However, in the above-described conventional substrate processing apparatus, gases may not be always uniformly supplied onto the substrate to be processed with a high level of exposure. For example, when the gases are, in one region, supplied from one end of the region and is exhausted through the other end, even though the exposure level of the gases on the plane of the substrate is sufficient at the one end, it may be insufficient at the other end. In addition, if an attempt is made to secure a sufficient exposure level of gases to the substrate, a throughput of the film forming process may be likely to be decreased. For example, in each region, if an upper space of the substrate is spacious, the gases may be diffused due to the spacious area, which may result in difficulty in securing a high gas flow velocity. Further, it may take a long time to spread the gases throughout the surface of the substrate or to supply or exhaust the gases into or from the region.

SUMMARY

The present disclosure provides some embodiments of a technique that is capable of uniformly supplying a gas with a high level of exposure onto a substrate and performing a process with a high throughput.

According to one embodiment of the present disclosure, there is provided a substrate processing apparatus, including: a processing chamber having a first processing region and a second processing region; a substrate mounting table on which a substrate to be processed is mounted, the substrate mounting table being rotatably installed in the processing chamber; and a rotation instrument configured to rotate the substrate mounting table such that the substrate passes through the first processing region and the second processing region in this order, wherein at least one of the first processing region and the second processing region includes: a gas supply part that includes a line-shaped opening portion extending in a radial direction of the substrate mounting table and is configured to supply a gas from the opening portion into the at least one region; and a gap holding member that protrudes from a ceiling of the processing chamber opposing the substrate, around the opening portion, toward the substrate such that a space on the surface of the substrate has a gap of a predetermined distance, the space serving as a passage of the gas supplied by the gas supply part.

DETAILED DESCRIPTION

One Embodiment of the Present Disclosure

Figure 1:
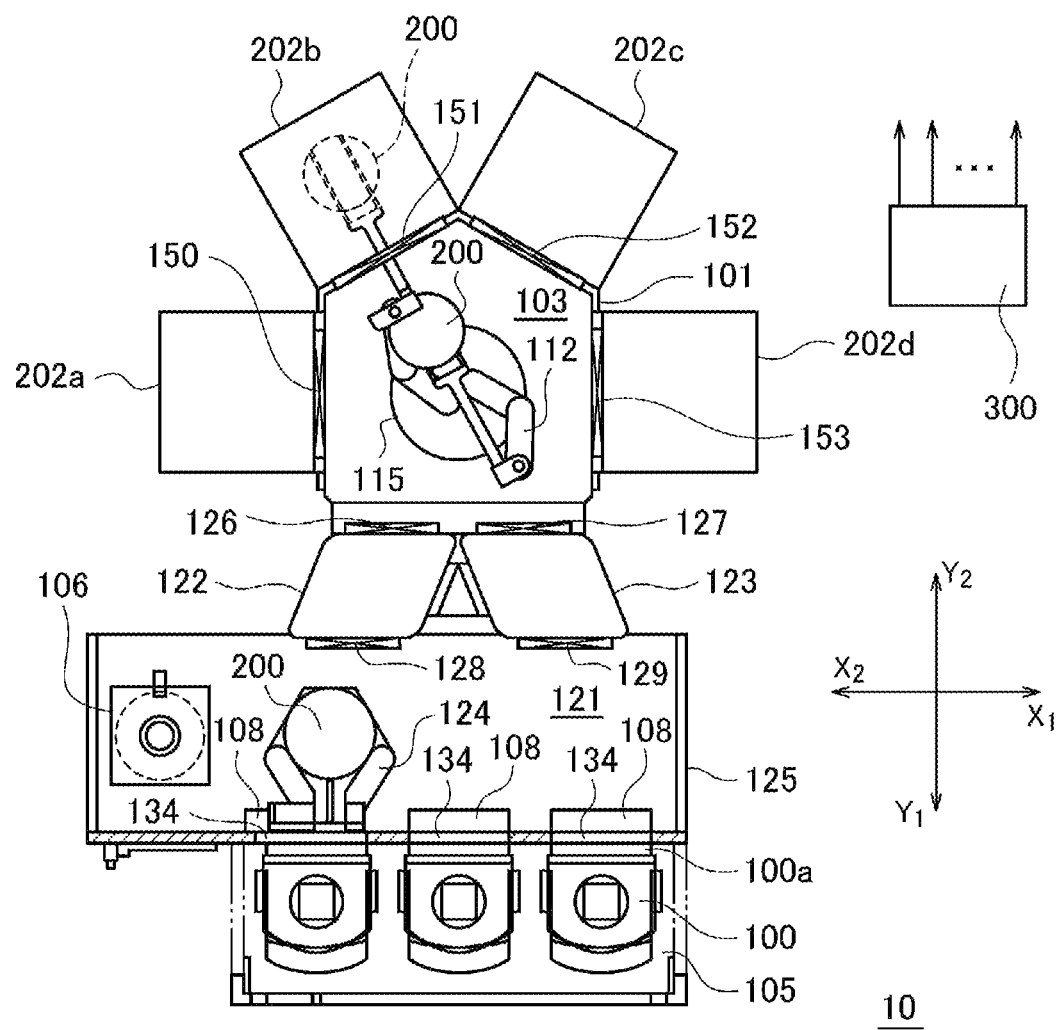
FIG. 1 is a schematic horizontal sectional view of a cluster type substrate processing apparatus according to one embodiment of the present disclosure.
Figure 2:
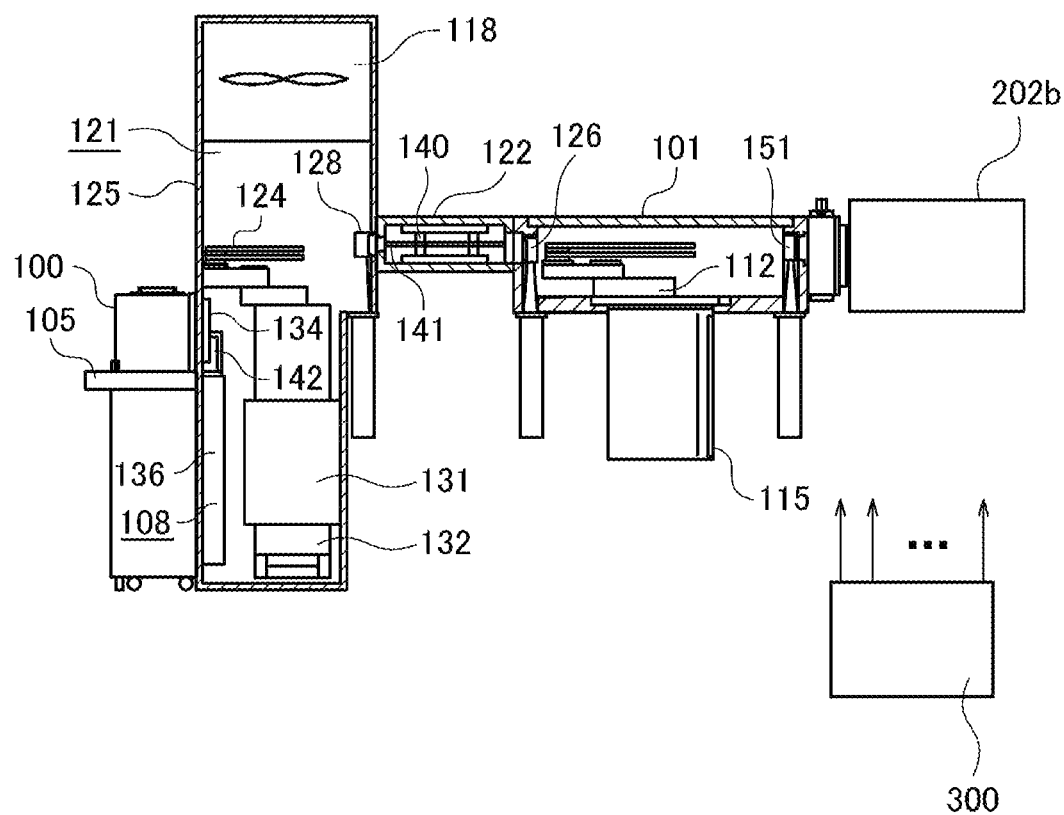
FIG. 2 is a schematic vertical sectional view of a cluster type substrate processing apparatus according to one embodiment of the present disclosure.

One embodiment of the present disclosure will now be described in detail with reference to the drawings.
(1) Configuration of Substrate Processing Apparatus The overview of a substrate processing apparatus 10 according to the present embodiment will first be described with reference to FIGS. 1 and 2. FIG. 1 is a schematic horizontal sectional view of a cluster type substrate processing apparatus 10 according to the present embodiment. FIG. 2 is a schematic vertical sectional view of the cluster type substrate processing apparatus 10 according to the present embodiment. In the following description, the front, rear, left and right directions are defined on the basis of the indications provided in FIG. 1. Specifically, in FIG. 1, the direction of $X_1$ is the right side, the direction of $X_2$ is the left side, the direction of $Y_1$ is the front side, and the direction of $Y_2$ is the rear side.

In the substrate processing apparatus 10 according to the present embodiment, a film forming process using an alternate supply method is performed onto a substrate to be processed. An example of the substrate to be processed may include a semiconductor wafer substrate (hereinafter simply referred to as a "wafer") 200 from which semiconductor devices are made. In the substrate processing apparatus 10 according to the present embodiment, FOUP (Front Opening Unified Pod, which will be hereinafter abbreviated as Pod) 100 is used as a carrier for transferring wafers 200.

The substrate processing apparatus 10 according to the present embodiment is a so-called cluster type including a transfer device and a plurality of process chambers arranged therearound. The transfer device of the cluster type substrate processing apparatus 10 includes a vacuum side configuration and an atmosphere side configuration.
(Vacuum Side Configuration)

As shown in FIGS. 1 and 2, the substrate processing apparatus 10 includes a first transfer chamber 103 capable of resisting a pressure (negative pressure) lower than an atmospheric pressure, such as a vacuum state or the like. A housing 101 of the first transfer chamber 103 has, for example, a pentagonal shape, when viewed from a plane, and has a box shape with its both upper and lower ends closed. The phrase "when viewed from a plane" used herein means that the substrate processing apparatus 10 is viewed from a vertical upper side toward a vertical lower side.

Within the first transfer chamber 103, there is installed a first wafer transfer device 112 that is configured to simultaneously transfer two sheets of wafers 200 under the negative pressure. The first wafer transfer device 112 is configured to be moved up and down by a first wafer transfer device elevator 115, while maintaining the airtightness of the first transfer chamber 103.

Pre-chambers (load lock chambers) 122 and 123 are connected to a front sidewall of five sidewalls of the housing 101, via gate valves 126 and 127, respectively. Each of the pre-chambers 122 and 123 are configured to be used in combination for carrying-in and carrying-out the wafers 200 and to resist the negative pressure.

Within each of the pre-chambers 122 and 123, two sheets of the wafers 200 may be stacked by a substrate support table 140. A separation plate (intermediate plate) 141 is interposed between the wafers 200 in each of the pre-chambers 122 and 123.

A first process chamber 202a, a second process chamber 202b, a third process chamber 202c and a fourth process chamber 202d, in each of which a desired process is performed on the substrates, are adjacent and connected to four rear sidewalls of the five sidewalls of the housing 101 of the first transfer chamber 103, through gate valves 150, 151, 152 and 153, respectively. These processor chambers 202a to 202d will be described in more detail later.
(Atmosphere Side Configuration)

A second transfer chamber 121 in which the wafers 200 are transferred under a vacuum pressure and atmospheric pressure is connected to the front sides of the pre-chambers 122 and 123 through gate valves 128 and 129. A second wafer transfer device 124 for transferring the wafers 200 is installed in the second transfer chamber 121. The second wafer transfer device 124 is configured to be moved up and down by a second wafer transfer device elevator 131 installed in the second transfer chamber 121 and to be enabled to reciprocate in a left-right direction by a linear actuator 132.

A notch aligning device 106 is installed in the left side of the second transfer chamber 121. The notch aligning device 106 may be an orientation flat aligning device. In addition, a clean unit 118 for supplying a clean air is installed at the top of the second transfer chamber 121.

Figure 3:
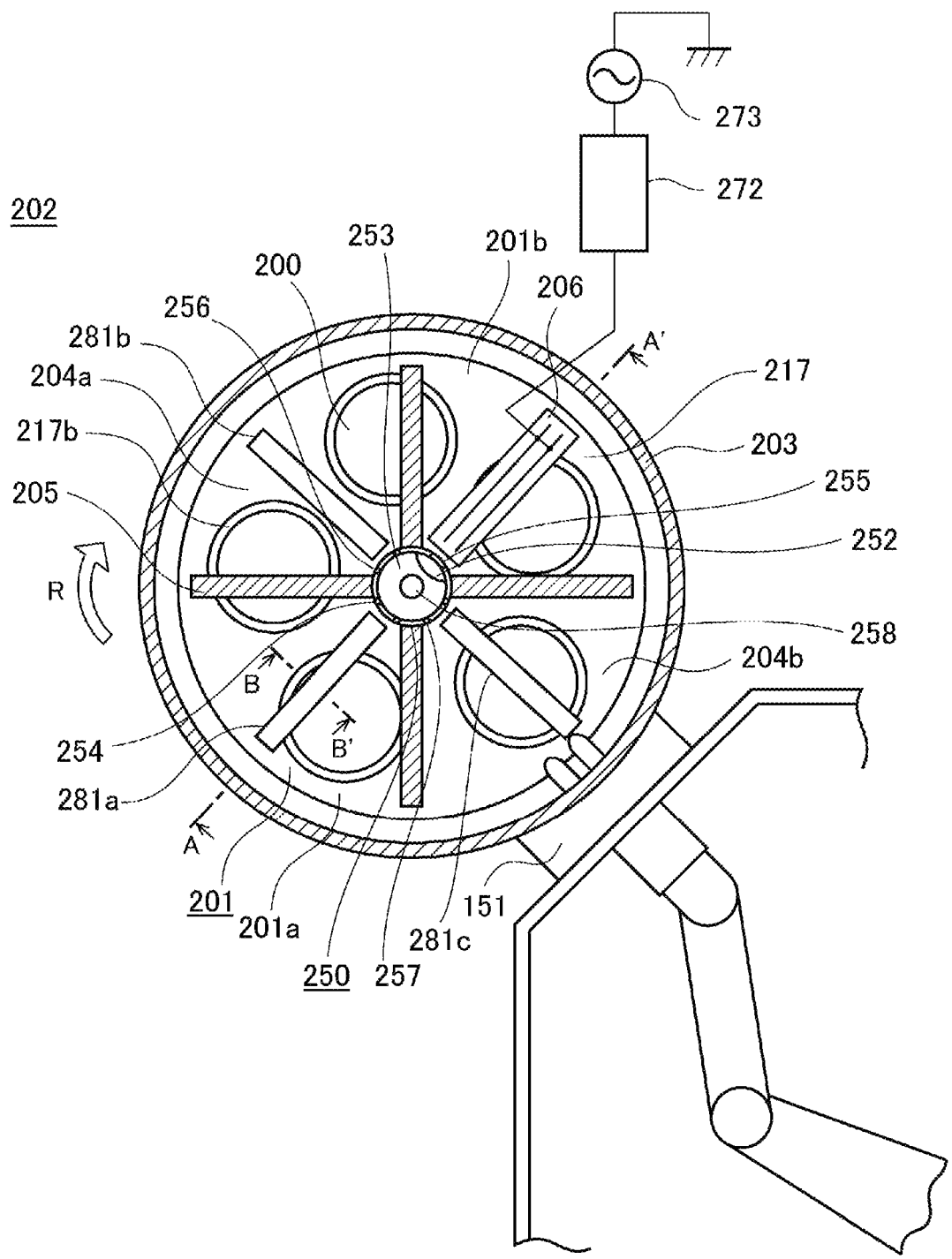
FIG. 3 is a schematic horizontal sectional view of a process chamber of a substrate processing apparatus according to one embodiment of the present disclosure.
Figure 4:
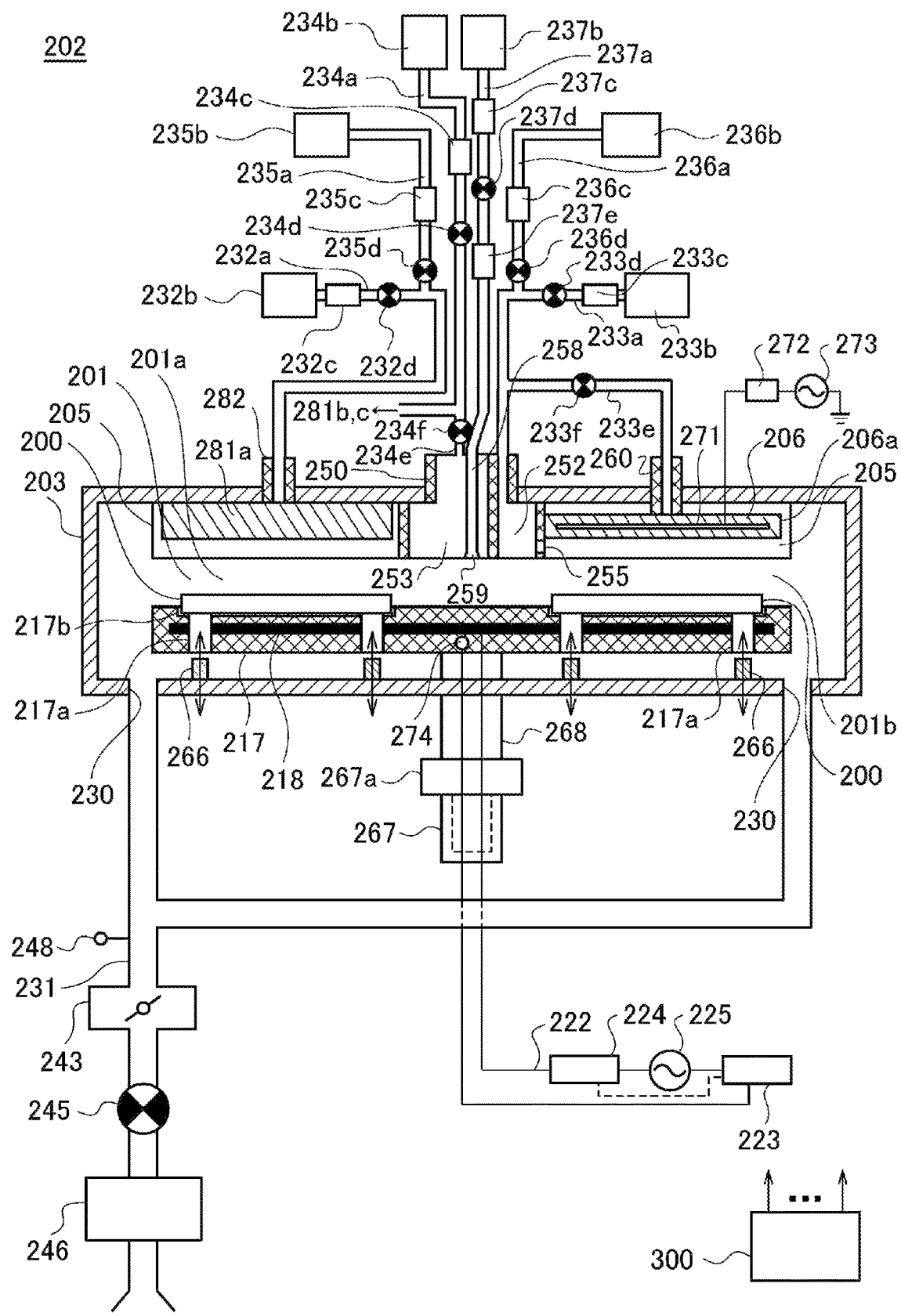
FIG. 4 is a schematic vertical sectional view of a process chamber of a substrate processing apparatus according to one embodiment of the present disclosure, which is taken along line A-A' of the process chamber in FIG. 3.

Substrate loading/unloading ports 134 for loading/unloading the wafers 200 into/from the second transfer chamber 121, and respective pod openers 108 are installed in the front side of a housing 125 of the second transfer chamber 121. A load port (JO stage) 105 is installed in the opposite side of the pod openers 108, that is, in the outside of the housing 125, with the substrate loading/unloading ports 134 interposed therebetween. Each of the pod openers 108 includes a closure 142 that is capable of opening/closing a cap 100a of a pod 100 and blocking the substrate loading/unloading port 134, and a driving mechanism 136 for driving the closure 142. The pod opener 108 allows the wafers 200 to be moved into and out of the pod 100 by opening/closing the cap 100a of the pod 100 mounted in the load port 105. In addition, the pod 100 is supplied in and discharged from the load port 105 by means of an intra-process transfer device (e.g., an OHT) (not shown in the drawings).
(2) Configuration of Process Chamber Subsequently, the configuration of the process chamber as a processing furnace of the substrate processing apparatus 10 according to the present embodiment will be described with reference to FIGS. 3 and 4. FIG. 3 is a schematic horizontal sectional view of the process chamber employed in the substrate processing apparatus 10 according to the present embodiment. FIG. 4 is a schematic vertical sectional view of the process chamber employed in the substrate processing apparatus 10 according to the present embodiment, which is taken along line A-A' in the process chamber shown in FIG. 3.

In the present embodiment, for example, the first process chamber 202a, the second process chamber 202b, the third process chamber 202c and the fourth process chamber 202d have substantially the same configuration. In the following description, the first process chamber 202a, the second process chamber 202b, the third process chamber 202c and the fourth process chamber 202d will be generically referred to as the "processor chamber 202." The process chamber 202 according to the present embodiment is configured as a multi-wafer device of a substrate revolution type, as will be described in detail below.

(Processing Chamber)

As shown in FIGS. 3 and 4, the process chamber 202 as a processing furnace is provided with a cylindrical sealed reaction container 203. The reaction container 203 is provided with a processing chamber 201 for processing the wafers 200.

The processing chamber 201 is partitioned into a plurality of regions, including, for example, a first processing region 201a, a first purge region 204a, a second processing region 201b and a second purge region 204b. The first purge region 204a and the second purge region 204b are interposed between the first processing region 201a and the second processing region 201b. As will be described later, a precursor gas as a first processing gas is supplied into the first processing region 201a, thereby putting the region 201a under a precursor gas atmosphere. A reaction gas as a second processing gas moves into a plasma state in the second processing region 201b, thereby putting the region 201b under a plasma-excited reaction gas atmosphere. An inert gas is supplied into the first purge region 204a and the second purge region 204b, thereby putting the regions 204a and 204b under an inert gas atmosphere. Thus, depending on the gas supplied to each of the regions, the wafers 200 are subjected to a predetermined processing.

In order to partition the interior of the processing chamber 201 into a plurality of regions, four partitioning plates 205 extending radially from the center are installed, for example, in the upper side of the reaction container 203. The four partitioning plates 205 are configured to partition the processing chamber 201 into the first processing region 201a, the first purge region 204a, the second processing region 201b and the second purge region 204b through which the wafers 200 can pass by rotation of a susceptor 217, which will be described later. Specifically, the processing chamber 201 has a gap below the plurality of partitioning plates 205 through which the wafers 200 can pass. The plurality of partitioning plates 205 is also installed to block a space from the ceiling of the processing chamber 201 to just above the susceptor 217. The lower ends of the partitioning plates 205 are disposed in proximity to the susceptor 217 to such a degree that the partitioning plates 205 do not interfere with the wafers 200. Thus, gases passing between the partitioning plates 205 and the susceptor 217 are decreased to prevent the gases from being mixed among the respective regions in the processing chamber 201.

Line-shaped gas supply parts 281a, 281b and 281c for supplying gases are installed in at least one of the first processing region 201a, the second processing region 201b, the first purge region 204a and the second purge region 204b (specifically, in the present embodiment, in the first processing region 201a, the first purge region 204a and the second purge region 204b, respectively). The line-shaped gas supply parts 281a, 281b and 281c will be described in detailed later. In addition, in the present embodiment, at least a portion of a plasma generating part 206 is installed in the second processing region 201b. The plasma generating part 206 will be also described in detail later.

In the reaction container 203, between end portions of the partitioning plates 205 in the horizontal direction and the sidewall of the reaction container 203 may be provided an opening having a predetermined width. If this opening is formed, by setting the internal gas pressures of the first purge region 204a and the second purge region 204b to be higher than the internal gas pressures of the first processing region 201a and the second processing region 201b, an inert gas can be ejected through this opening. Thus, it is possible to prevent the first processing gas or the second processing gas from entering the first purge region 204a and the second purge region 204b, thereby preventing reaction of the processing gases in the first purge region 204a and the second purge region 204b.

When a rotation speed of the susceptor 217 to be described below is constant, a time for which the wafers 200 pass through each of the first processing region 201a, the first purge region 204a, the second processing region 201b and the second purge region 204b, i.e., a processing time of the wafers 200 in each region, depends on the area (volume) of each region. In addition, the processing time of the wafers 200 in each region depends on the area of each of the first processing region 201a, the first purge region 204a, the second processing region 201b and the second purge region 204b, when viewed from the plane, at the constant rotation speed of the susceptor 217 to be described below. In other words, the processing time of the wafers 200 in each region depends on an angle formed between adjacent partitioning plates 205. In the present embodiment, the four partitioning plates 205 are disposed to make processing times of the wafers 200 in the regions substantially equal to each other.

(Susceptor)

The susceptor 217 as a rotatable substrate mounting table, which has, for example, a rotary shaft at the center of the reaction container 203, is installed at the lower side of the partitioning plates 205, i.e., the bottom-side center in the reaction container 203. The susceptor 217 is made of a non-metallic material, such as, e.g., aluminum nitride (AlN), ceramics or quartz, so as to reduce metal contamination of the wafers 200. In addition, the susceptor 217 is electrically insulated from the reaction container 203.

The susceptor 217 is configured to support a plurality of (for example, 5) wafers 200 arranged on the same plane along the same circumference of a rotation direction in the reaction container 203. The term "same plane" used herein is not limited to the completely same plane, but is intended to allow the plurality of wafers 200 to be arranged in a non-overlapping manner when viewed from above the susceptor 217.

The same number of wafer mounting tables 217b as the number of wafers to be processed are installed at supporting positions of the wafers 200 on the surface of the susceptor 217. The wafer mounting tables 217b are arranged at the positions on the same circumference from the center of the susceptor 217 with equal intervals (for example, 72° intervals).

Each of the wafer mounting tables 217b has, e.g., a circular shape when viewed from the upper surface of the susceptor 217 and has, e.g., a concave shape when viewed from the side surface of the susceptor 217. The diameter of each wafer mounting table 217b may be slightly larger than that of each wafer 200. Mounting the wafer 200 in the wafer mounting table 217b facilitates positioning of the wafer 200 and can prevent any dislocation of the wafer 200 which may occur, for example, when the wafer 200 is dislocated from the susceptor 217 due to a centrifugal force caused by the rotation of the susceptor 217.

The susceptor 217 is provided with an elevating instrument 268 to elevate the susceptor 217 up and down. A plurality of through holes 217a is provided at positions of the wafer mounting tables 217b of the susceptor 217. In the bottom of the reaction container 203 is installed a plurality of wafer lift pins 266 to push and support the rear surfaces of the wafers 200 when the wafers 200 are loaded or unloaded into or out of the reaction container 203. The through holes 217a and the wafer lift pins 266 are arranged in a relative manner that the wafer lift pins 266 pass through the through holes 217a without contacting the susceptor 217 when the wafer lift pins 266 are ascended or when the susceptor 217 is descended by the elevating instrument 268.

The elevating instrument 268 is provided with a rotation mechanism 267 to rotate the susceptor 217 such that the plurality of wafers 200 passes through the first processing region 201a, the first purge region 204a, the second processing region 201b and the second purge region 204b in this order. A rotary shaft (not shown) of the rotation mechanism 267 is connected to the susceptor 217 so that the plurality of wafer mounting tables 217b are configured to simultaneously rotate as the susceptor 217 is rotated.

The rotation mechanism 267 is connected to a controller 300 to be described later through a coupling unit 267a. The coupling unit 267a is formed as, e.g., a slip ring mechanism to electrically interconnect a rotating side and a fixed side using a metal brush or the like. The rotation of the susceptor 217 is not disturbed.

(Heating Part)

A heater 218 as a heating unit is integrally embedded in the susceptor 217 to heat the wafers 200. The heater 218 is configured to heat the surface of the wafers 200 to a predetermined temperature (for example, room temperature to about 1,000 degrees C.). The heater 218 may be configured to heat independently the respective wafers 200 mounted on the susceptor 217.

A temperature sensor 249 is installed in the susceptor 217. The heater 218 and the temperature sensor 249 are electrically connected to a power adjustor 224, a heater power source 225 and a temperature adjustor 223 through a power supply line 222.

(Gas Supply Part)

A tubular gas supply part 250 is, for example, installed in the central portion of the ceiling of the reaction container 203. The upper end of the gas supply part 250 is air-tightly connected to an opening formed in the ceiling of the reaction container 203.

The tubular interior of the gas supply part 250 is partitioned into a second processing gas supply part 252, an inert gas supply part 253 and a cleaning gas supply part 258. Specifically, the second processing gas supply part 252 is installed in the second processing region 201b in the gas supply part 250. The inert gas supply part 253 is installed in the first processing region 201a, the first purge region 204a and the second purge region 204b in the gas supply part 250. The cleaning gas supply part 258 is installed in the center of the gas supply part 250.

A second processing gas ejection hole 255 opened to the second processing region 201b is formed in the sidewall of the second processing gas supply part 252 in the second processing region 201b.

An inert gas ejection hole 254 opened to the first processing region 201a is formed in the sidewall of the inert gas supply part 253 in the first processing region 201a. An inert gas ejection hole 256 opened to the first purge region 204a is formed in the sidewall of the inert gas supply part 253 in the first purge region 204a. An inert gas ejection hole 257 opened to the second purge region 204b is formed in the sidewall of the inert gas supply part 253 of the second purge region 204b. These inert gas ejection holes 254, 256 and 257 are respectively formed to correspond to the line-shaped gas supply parts 281a, 281b and 281c to be described below. Each of the inert gas ejection holes 254, 256 and 257 is comprised of two openings that are respectively arranged near corresponding both partitioning plates 205 with the line-shaped gas supply parts 281a, 281b and 281c interposed therebetween so that the inert gas is ejected along the both partitioning plates 205.

A cleaning gas supply hole 259, which is an end portion of the cleaning gas supply part 258, is formed in the bottom of the gas supply part 250. That is, the cleaning gas supply hole 259 is formed to be lower than the second processing gas ejection hole 255 and the inert gas ejection holes 254, 256 and 257.

In the present embodiment, gas supply parts are also installed to supply gases to each of the line-shaped gas supply parts 281a, 281b and 281c to be described later and to the plasma generating part 206.

A first processing gas supply part 282 for supplying a gas into the line-shaped gas supply part 281a is installed in the ceiling of the reaction container 203 in the first processing region 201a. The upper end of the first processing gas supply part 282 is air-tightly connected to the opening formed in the ceiling of the reaction container 203. The lower end of the first processing gas supply part 282 is connected to the top of the line-shaped gas supply part 281a.

A first inert gas supply part (not shown) for supplying a gas into the line-shaped gas supply part 281b is installed in the ceiling of the reaction container 203 in the first purge region 204a. A second inert gas supply part (not shown) for supplying a gas into the line-shaped gas supply part 281c is installed in the ceiling of the reaction container 203 in the second purge region 204b. The upper ends of these inert gas supply parts are all air-tightly connected to the opening formed in the ceiling of the reaction container 203. The lower ends of these inert gas supply parts are connected to the top of the line-shaped gas supply part 281b or line-shaped gas supply part 281c.

A plasma generating part side gas supply part 260 for supplying a gas into the plasma generating part 206 is installed in the ceiling of the reaction container 203 in the second processing region 201b. The upper end of the plasma generating part side gas supply part 260 is air-tightly connected to the opening formed in the ceiling of the reaction container 203. The lower end of the plasma generating part side gas supply part 260 is connected to the top of the plasma generating part 206.

(First Processing Gas Supply System)

The downstream end of a first processing gas supply pipe 232a is connected to the upper end of the first processing gas supply part 282 for supplying the gas into the line-shaped gas supply part 281a. From the upstream side of the first processing gas supply pipe 232a are installed a first processing gas supply source 232b, a mass flow controller (MFC) 232c as a flow rate controller (flow rate control part), and a valve 232d as an opening/closing valve in this order.

The first processing gas, which is a gas containing a first element, is supplied from the first processing gas supply pipe 232a into the first processing region 201a via the MFC 232c, the valve 232d, the first processing gas supply part 282 and the line-shaped gas supply part 281a. In the present embodiment, the first processing gas is used as a precursor gas. The term "precursor gas" used herein, which is a kind of processing gas, refers to a gas to be material for forming a film. The precursor gas includes at least one of, for example, titanium (Ti), tantalum (Ta), silicon (Si), hafnium (Hf), zirconium (Zr), ruthenium (Ru), nickel (Ni) and tungsten (W), as the first element for constituting the film.

Specifically, in this embodiment, the precursor gas is, for example, a $TiCl_4$ gas. When a precursor in the precursor gas is in a liquid phase under the room temperature, like $TiCL_4$, the MFC 232c is a mass flow controller for liquid and a vaporizer (not shown) is interposed between the MFC 232c and the valve 232d. When the precursor in the precursor gas is gas under the room temperature, the MFC 232c is a mass flow controller for gas and no vaporizer is required.

A precursor gas supply system (first processing gas supply system) is mainly constituted by the first processing gas supply pipe 232a, the MFC 232c, the valve 232d, the first processing gas supply part 282 and the line-shaped gas supply part 281a. The precursor gas supply system may include at least one of the first processing gas supply source 232b and the vaporizer.

(Second Processing Gas Supply System)

The downstream end of a second processing gas supply pipe 233a is connected to the upper end of the second processing gas supply part 252 in the gas supply part 250. From the upstream side of the second processing gas supply pipe 233a are installed a second processing gas supply source 233b, an MFC 233c as a flow rate controller (flow rate control part), and a valve 233d as an opening/closing valve in this order.

The upstream end of a second processing gas branch pipe 233e is connected to the downstream side of the valve 233d of the second processing gas supply pipe 233a. The downstream end of the second processing gas branch pipe 233e is connected to the upper end of the plasma generating part side gas supply part 260. A valve 233f as an opening/closing valve is installed in the second processing gas branch pipe 233e.

The second processing gas, which is a gas containing a second element, is supplied from the second processing gas supply pipe 233a into the second processing region 201b via the MFC 233c, the valve 233d, the second processing gas supply part 252 and the second processing gas ejection hole 255 or via the second processing gas branch pipe 233e, the valve 233f, the plasma generating part side gas supply part 260 and a gas supply path and a gas ejection hole in the plasma generating part 206. At this time, the second processing gas is plasmarized by the plasma generating part 206.

In the present embodiment, the second processing gas is used as a reaction gas. The term "reaction gas" used herein, which is a kind of processing gas, refers to a gas to be plasmarized, as described later, to react with a first element-containing layer formed on the wafers 200 with the precursor gas. The reaction gas contains the second element different from the first element contained in the precursor gas. An example of the second element may include at least one of oxygen (O), nitrogen (N), carbon (C) and hydrogen (H), or a combination thereof.

In this embodiment, the reaction gas is, for example, a nitrogen-containing gas. Specifically, an ammonia ($NH_3$) gas is used as the nitrogen-containing gas. A material having viscosity lower than that of the precursor gas is used for the reaction gas.

A reaction gas supply system (second processing gas supply system) is mainly constituted by the second processing gas supply pipe 233a, the MFC 233c, the valve 233d, the second processing gas supply part 252, the second processing gas ejection hole 255, the second processing gas branch pipe 233e and the valve 233f. The reaction gas supply system may include the second processing gas supply source 233b and the gas supply path and the gas ejection hole in the plasma generating part 206.

(Inert Gas Supply System)

The downstream end of a first inert gas supply pipe 234a is connected to a first inert gas supply part (not shown) for supplying a gas into the line-shaped gas supply part 281b and a second inert gas supply part (not shown) for supplying a gas into the line-shaped gas supply part 281c, respectively. From the upstream side of the first inert gas supply pipe 234a are installed an inert gas supply source 234b, an MFC 234c as a flow rate controller (flow rate control part), and a valve 234d as an opening/closing valve in this order.

The inert gas is supplied from the first inert gas supply pipe 234a into the first purge region 204a and the second purge region 204b via the MFC 234c, the valve 234d, the first inert gas supply part (not shown), the line-shaped gas supply part 281b, the second inert gas supply part (not shown) and the line-shaped gas supply part 281c. The inert gas supplied into the first purge region 204a and the second purge region 204b acts as a purge gas.

The upstream end of a first inert gas branch pipe 234e is connected to the downstream side of the valve 234d of the first inert gas supply pipe 234a. The downstream end of the first inert gas branch pipe 234e is connected to the upper end of the inert gas supply part 253 in the gas supply part 250. A valve 234f as an opening/closing valve is installed in the first inert gas branch pipe 234e.

The inert gas is supplied from the first inert gas branch pipe 234e into the first processing region 201a, the first purge region 204a and the second purge region 204b via the first inert gas supply pipe 234a, the valve 234f, the inert gas supply part 253 and the inert gas ejection holes 254, 256 and 257. The inert gases ejected from the inert gas ejection holes 254, 256 and 257 forms a gas flow along the partitioning plates 205, as will be described later.

In this embodiment, for example, a nitrogen ($N_2$) gas is used as the inert gas. As the inert gas, a rare gas such as a helium (He) gas, a neon (Ne) gas, an argon (Ar) gas or the like may be used in addition to the $N_2$ gas.

A first inert gas supply system is mainly constituted by the first inert gas supply pipe 234a, the MFC 234c, the valve 234d, the first inert gas supply part (not shown), the line-shaped gas supply part 281b, the second inert gas supply part (not shown), the line-shaped gas supply part 281c, the first inert gas branch pipe 234e, the valve 234f, the inert gas supply part 253 and the inert gas ejection holes 254, 256 and 257. The first inert gas supply system may include the inert gas supply source 234b.

The downstream end of a second inert gas supply pipe 235a is connected to the downstream side of the valve 232d of the first processing gas supply pipe 232a. From the upstream side of the second inert gas supply pipe 235a are installed an inert gas supply source 235b, an MFC 235c as a flow rate controller (flow rate control part), and a valve 235d as an opening/closing valve in this order.

The inert gas is supplied from the second inert gas supply pipe 235a into the first processing region 201a via the MFC 235c, the valve 235d, the first processing gas supply pipe 232a, the first processing gas supply part 282 and the line-shaped gas supply part 281a. The inert gas supplied from the line-shaped gas supply part 281a into the first processing region 201a acts as a carrier gas or a dilution gas. Like the first inert gas supply system, an $N_2$ gas or the like is used as the inert gas.

A second inert gas supply system is mainly constituted by the second inert gas supply pipe 235a, the MFC 235c and the valve 235d. The second inert gas supply system may include the inert gas supply source 235b, the first processing gas supply pipe 232a, the first processing gas supply part 282 and the line-shaped gas supply part 281a.

The downstream end of a third inert gas supply pipe 236a is connected to the downstream side of the valve 233d of the second processing gas supply pipe 233a. From the upstream side of the third inert gas supply pipe 236a are installed an inert gas supply source 236b, an MFC 236c as a flow rate controller (flow rate control part), and a valve 236d as an opening/closing valve in this order.

The inert gas is supplied from the third inert gas supply pipe 236a into the second processing region 201b via the MFC 236c, the valve 236d, the second processing gas supply pipe 233a, the second processing gas supply part 252 and the second processing gas ejection hole 255, or via the second processing gas branch pipe 233e, the valve 233f, the plasma generating part side gas supply part 260 and the gas supply path and the gas ejection hole in the plasma generating part 206. Like the inert gas supplied into the first processing region 201a, the inert gas supplied into the second processing region 201b acts as a carrier gas or a dilution gas. Like the first inert gas supply system, an $N_2$ gas or the like is used as the inert gas.

A third inert gas supply system is mainly constituted by the third inert gas supply pipe 236a, the MFC 236c and the valve 236d. The third inert gas supply system may include the inert gas supply source 236b, the second processing gas supply pipe 233a, the second processing gas supply part 252, the second processing gas ejection hole 255, the second processing gas branch pipe 233e, the valve 233f, and the gas supply path and the gas ejection hole in the plasma generating part 206.

(Cleaning Gas Supply System)

The substrate processing apparatus 10 of the present embodiment may include a cleaning gas supply system. A downstream end of a cleaning gas supply pipe 237a is connected to the upper end of the cleaning gas supply part 258 in the gas supply part 250. From the upstream side of the cleaning gas supply pipe 237a are installed a cleaning gas supply source 237b, an MFC 237c as a flow rate controller (flow rate control part), a valve 237d as an opening/closing valve, and a plasma generation unit 237e for generating plasma of a cleaning gas in this order.

The cleaning gas is supplied from the cleaning gas supply pipe 237a into the reaction container 203 via the MFC 237c, the valve 237d, the remote plasma generation unit 237e, the cleaning gas supply part 258 and the cleaning gas supply hole 259. In the reaction container 203, when the cleaning gas plasmarized by the remote plasma generation unit 237e is supplied, byproducts are cleaned away. The cleaning gas is, for example, at least one of a nitrogen trifluoride ($NF_3$) gas, a hydrogen fluoride (HF) gas, a chlorine trifluoride ($ClF_3$) gas and a fluorine ($F_2$) gas.

(Exhaust System)

As shown in FIG. 4, an exhaust port 230 for exhausting the interior of the reaction container 203 is formed near the outer periphery of the susceptor 217 in the bottom of the reaction container 203. In this embodiment, for example, a plurality of exhaust ports 230 is formed to correspond to the first processing region 201a, the first purge region 204a, the second processing region 201b and the second purge region 204b, respectively.

The upstream ends of exhaust pipes 231 are connected to the exhaust ports 230, respectively. For example, the exhaust pipes 231 connected respectively to the exhaust ports 230 are joined at the downstream side. A vacuum pump 246 as a vacuum exhauster is connected to the downstream side of the joining site of the exhaust pipes 231 via a pressure sensor 248, an APC (Auto Pressure Controller) valve 243 as a pressure adjustor (pressure adjusting part), and a valve 245 as an opening/closing valve. The APC valve 243 is an opening/closing valve that facilitates or stops the vacuum exhaust in the processing chamber 201 by opening/closing the valve and that adjusts the internal pressure of the processing chamber 201 by regulating the degree of valve opening.

Thus, the internal pressure of the processing chamber 201 is configured to have a predetermined pressure (degree of vacuum). An exhaust system is mainly constituted by the exhaust pipes 231, the APC valve 243 and the valve 245. The exhaust system may include the pressure sensor 248 and the vacuum pump 246.

(Plasma Generating Part)

As shown in FIGS. 3 and 4, at least a portion of the plasma generating part 206 is installed in the upper side of the second processing region 201b. The plasma generating part 206 is configured to generate plasma of the reaction gas in the second processing region 201b. Thus, the plasma can be used to activate the reaction gas to process the wafers 200 even when the temperature of the wafers 200 is low.

A pair of rod-shaped electrodes 271 arranged in the horizontal direction is, for example, disposed in the second processing area 201b. The pair of electrodes 271 is covered by a cover 206a made of, for example, quartz. The above-mentioned reaction gas supply path is formed in the cover 206a of the plasma generating part 206.

A high-frequency power source 273 is connected to the pair of electrodes 271 via a matching device 272 for matching impedance. When the high-frequency power is applied from the high-frequency power source 273 to the electrodes 271, plasma is generated in the vicinity of the pair of electrodes 271. In addition, the plasma is mainly generated immediately below the pair of electrodes 271. Thus, the plasma generating part 206 generates so-called capacitive coupling type plasma.

For example, the pair of electrodes 271 of the plasma generating part 206 is disposed, when viewed from the plane, along the radial direction from the center of the reaction container 203 toward the outer side thereof and in parallel to the top of the wafers 200. The pair of electrodes 271 is disposed on a path through which the wafers 200 pass. The length of the pair of electrodes 271 in the longitudinal direction is longer than the diameter of the wafers 200. Thus, the plasma is sequentially irradiated on the entire surface of the wafers 200 passing immediately below the pair of electrodes 271.

The plasma generating part 206 is mainly constituted by the pair of electrodes 271. The plasma generating part 206 may include the matching device 272 and the high-frequency power source 273.

(3) Configuration of Region Having Line-Shaped Gas Supply Part

Here, the first processing region 201a in which the line-shaped gas supply part 281a is installed, the first purge region 204a in which the line-shaped gas supply part 281b is installed, and the second purge region 204b in which the line-shaped gas supply part 281c is installed will be described in more detail.

Figure 5:
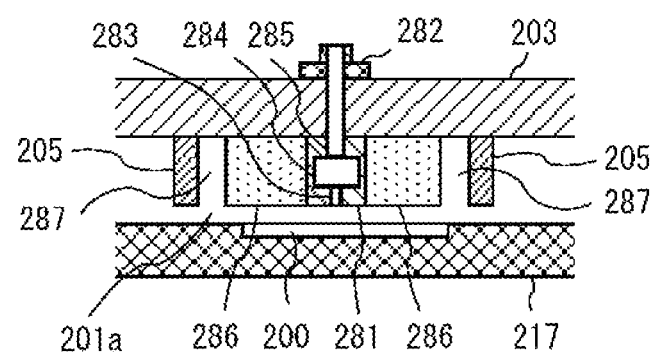
FIG. 5 is a schematic vertical sectional view of one region of a substrate processing apparatus, in which a line-shaped gas supply part is installed, according to one embodiment of the present disclosure, which is taken along line B-B' of the process chamber shown in FIG. 3.
Figure 6:
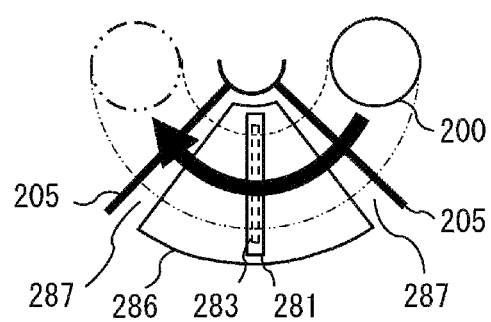
FIG. 6 is a schematic horizontal sectional view of one region of a substrate processing apparatus, in which a line-shaped gas supply part is installed, according to one embodiment of the present disclosure.

In this embodiment, the first processing region 201a, the first purge region 204a and the second purge region 204b have substantially the same configuration. Hereinafter, the configuration of the first processing region 201a in which the line-shaped gas supply part 281a is installed will be mainly described with reference to FIGS. 5 and 6 and explanation of the configurations of the first purge region 204a and the second purge region 204b is omitted. In the following description, the line-shaped gas supply part 281a in the first processing region 201a, the line-shaped gas supply part 281b in the first purge region 204a and the line-shaped gas supply part 281c in the second purge region 204b are collectively referred to as a "line-shaped gas supply part 281." FIG. 5 is a schematic vertical sectional view of the first processing region 201a where the line-shaped gas supply part 281a is installed in the substrate processing apparatus 10 according to the present embodiment, which is taken along line B-B' of the process chamber shown in FIG. 3. FIG. 6 is a schematic horizontal sectional view of the first processing region 201a where the line-shaped gas supply part 281a is installed in the substrate processing apparatus 10 according to the present embodiment.

(Line-Shaped Gas Supply Part)

As shown in FIGS. 5 and 6, the line-shaped gas supply part 281 is installed in the first processing region 201a in such a manner to protrude from the ceiling of the processing chamber 201 toward the wafer 200 on the susceptor 217. The line-shaped gas supply part 281 has a line-shaped opening portion 283, which is formed in its lower side (i.e., a side opposing the wafer 200 on the susceptor 217) and extends in the radial direction of the susceptor 217, and is configured to supply a gas into the first processing region 201a by ejecting the gas through the opening portion 283. The term "line-shaped" used herein refers to an elongated shape such as a line. That is, the opening portion 283 is formed by an opening that is continuous in a strip shape when viewed from the plane.

The size of the opening portion 283 in the longitudinal direction is larger than the diameter of the wafers 200 on the susceptor 217. The edge of the inner peripheral side of the opening portion 283 (the side of the rotation center of the susceptor 217) is located nearer to the rotation center of the susceptor 217 than a position through which the edge of the inner peripheral side of the wafer 200 passes, when the susceptor 217 is rotated. The edge of the outer peripheral side of the opening portion 283 is located nearer to the outer peripheral side of the susceptor 217 than a position through which the edge of the outer peripheral side of the wafer 200 passes, when the susceptor 217 is rotated. Alternatively, depending on the flow rate and pressure of the gas ejected from the opening portion 283, it is possible to place the opening portion 283 in a different way from the above. For example, the opening portion 283 may be placed closer to the rotation center or outer peripheral side of the susceptor 217.

The line-shaped gas supply part 281 encloses a gas buffer region 284 as a gas diffusion space at the upstream side of the opening portion 283 in a gas ejection direction (i.e., gas supply direction). The gas buffer region 284 serves as a space in which the gas is diffused before being ejected through the opening portion 283. Therefore, like the opening portion 283, the gas buffer region 284 is formed to extend in the radial direction of the susceptor 217. In order to serve as the gas diffusion space, the size (specifically, area) of the gas buffer region 284 is larger than the size of the opening portion 283 when viewed from the plane.

The downstream end of a gas supply connection pipe 285 is connected to the gas buffer region 284. The upstream end of the gas supply connection pipe 285 is connected to the first processing gas supply part 282. Thus, the first processing gas is supplied into the line-shaped gas supply part 281 via the first processing gas supply pipe 232a and the first processing gas supply part 282. The first processing gas supplied into the line-shaped gas supply part 281 is ejected into the first processing gas region 201a via the opening portion 283.

However, since the line-shaped gas supply part 281 encloses the gas buffer region 284, the gas from the gas supply connection pipe 285 is diffused in the entire gas buffer region 284 along the radial direction of the susceptor 217 before being ejected through the opening portion 283 into the first processing region 201a. Accordingly, the gas can be uniformly supplied through the opening portion 283 along the radial direction of the susceptor 217, thereby preventing the gas from being intensively supplied to a particular position (for example, a position near a connection site of the gas supply connection pipe 285).

As long as the gas can be uniformly supplied into the first processing region 201a, it may be unnecessary to connect the gas supply connection pipe 285 to the opening portion 283 via the gas buffer region 284. For example, if a plurality of gas supply connection pipes 285 are installed and each of the gas supply connection pipes 285 is connected to a different position of the opening portion 283, the gas can be uniformly supplied into the first processing region 201a.

(Gap Holding Member)

A gap holding member 286 as a gap holding unit is disposed in the first processing region 201a so as to surround the line-shaped gas supply part 281. The gap holding member 286 is installed to protrude from the ceiling of the processing chamber 201 toward the wafer 200 on the susceptor 217. Thus, the gap holding member 286 allows the gas supplied by the line-shaped gas supply part 281 to pass a space on the surface of the wafer, which has a gap of a predetermined distance. That is, the gap holding member 286 is installed to protrude toward the wafer 200 such that the space between the surface of the wafer 200 and the bottom of the gap holding member 286 around the line-shaped gas supply part 281 has the gap of the predetermined distance.

The predetermined distance of the gap is not particularly limited, but may be appropriately set in consideration of the pressure and flow rate of the gas supplied from the line-shaped gas supply part 281 and the planar area of the first processing region 201a. Specifically, in order to allow the gas supplied from the line-shaped gas supply part 281 to be spread over the entire first processing region 201a with efficiency and to allow the surface of the wafer 200 on the susceptor 217 to be sufficiently exposed to the supplied gas, the bottom of the gap holding member 286 may be disposed close to the susceptor 217 unless it interferes with the wafer 200.

In addition, in order to allow the gas supplied from the line-shaped gas supply part 281 to be spread over the entire first processing region 201a with efficiency, the gap holding member 286 may be formed in such a manner that its shape and size correspond to the shape and size of the first processing region 201a except portions where the line-shaped gas supply part 281 and a gas discharge region 287 to be described later are formed, when viewed from the plane. Thus, at least partially or entirely, the gap holding member 286 is formed to be wider than the line-shaped gas supply part 281 in the circumferential direction of the susceptor 217.

(Gas Discharge Region)

The gas discharge region 287 is formed in the first processing region 201a between the side surface of the partitioning plate 205 and the side surface of the gap holding member 286. The gas discharge region 287 is a space having lateral sides defined by the partitioning plate 205 and the gap holding member 286, an upper side defined by the ceiling of the processing chamber 201, and a lower side defined by the susceptor 217 or the wafer 200.

The inert gas ejection hole 254 of the gas supply part 250 is located at the rotation central side of the susceptor 217 in the gas discharge region 287. Thus, when an inert gas is ejected from the inert gas ejection hole 254 into the gas discharge region 287, the inert gas flows toward the outer peripheral side of the susceptor 217 along the wall of the partitioning plate 205.

Although it is illustrated in this embodiment that two gas discharge regions 287 are formed in the first processing region 201a along both partitioning plates 205 partitioning the first processing region 201a, the gas discharge region 287 may be, at least, disposed in the downstream side of the susceptor 217 in the rotation direction (see an arrow in FIG. 6) without being disposed in the upstream side thereof. In this case, it is possible to increase the exposure level of the gas from the upstream side, thereby increasing the use efficiency of the gas. On the other hand, since the exhaust efficiency of the gas is lower than that in a case where the gas discharge regions 287 are disposed in each of the upstream side and the downstream side, it may be difficult to remove generated reaction byproducts and residual gas. In particular, if the reaction byproducts generated in a region of the first processing region 201a where a gas reacts with the film on the wafer 200 are not exhausted, the reaction byproducts may be again deposited on the wafer 200 or inhibit the subsequent gas reaction. Therefore, for a region or process requiring a higher efficiency of exhaust of the reaction byproducts and residual gas, the gas discharge regions 287 are disposed in each of the upstream side and the downstream side.

(4) Configuration of Control Part

Figure 7:
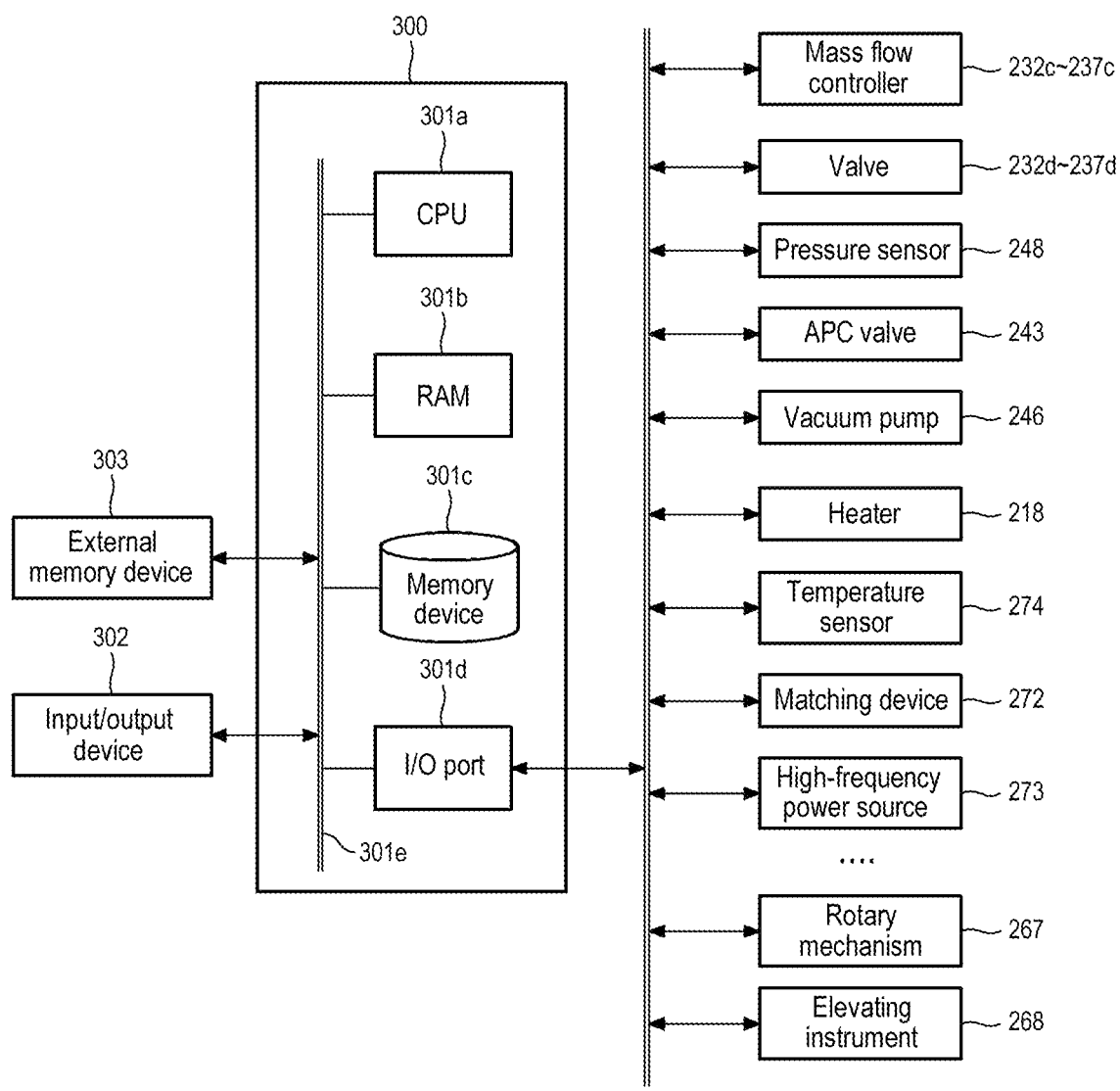
FIG. 7 is a schematic configuration view of a controller of a substrate processing apparatus, which is suitable to be used in one embodiment of the present disclosure.

The controller 300, which is a control unit (control means) of this embodiment, will now be described with reference to FIG. 7. FIG. 7 is a schematic configuration view of a controller of the substrate processing apparatus 10, which is suitable to be used in this embodiment.

As shown in FIG. 7, the controller 300, which is the control unit (control means), is configured as a computer including a central processing unit (CPU) 301a, a random access memory (RAM) 301b, a memory device 301c and an I/O port 301d. The RAM 301b, the memory device 301c and the I/O port 301d are configured to exchange data with the CPU 301a via an internal bus 301e. An input/output device 302 including, for example, a touch panel or the like, is connected to the controller 300.

The memory device 301c is configured by, for example, a flash memory, a hard disk drive (HDD), or the like. A control program for controlling operation of the substrate processing apparatus 10 or a process recipe, in which a sequence or conditions of a substrate processing such as film formation described later are written, is readably stored in the memory device 301c. Also, the process recipe functions as a program to cause the controller 300 to execute each sequence in the substrate processing process, which will be described later, to obtain a predetermined result. Hereinafter, the process recipe or control program may be generally referred to as "a program." Also, when the term "program" is used herein, it may include the case in which only the process recipe is included, the case in which only the control program is included, or the case in which both of the process recipe and the control program are included. In addition, the RAM 301b is configured as a memory area (work area) in which a program or data read by the CPU 301a is temporarily stored.

The I/O port 301d is connected to the MFCs 232c, 233c, 234c, 235c, 236c and 237c, the valves 232d, 233d, 233f, 234d, 243f, 235d, 236d and 237d, the pressure sensor 248, the APC valve 243, the vacuum pump 246, the heater 218, the temperature sensor 274, the matching device 272, the high-frequency power source 273, the rotation mechanism 267, the elevating instrument 268, and so forth. The I/O port 301d is also connected with the power adjustor 224, the heater power source 225 and the temperature adjustor 223 (not shown).

The CPU 301a is configured to read and execute the control program from the memory device 301c. The CPU 301a is also configured to read the process recipe from the memory device 301c in response to an operation command inputted from the input/output device 302. In addition, the CPU 301a is also configured to control, pursuant to contents of the read process recipe, the flow rate controlling operation of various types of gases by the MFCs 232c, 233c, 234c, 235c, 236c and 237c, the opening/closing operation of the valves 232d, 233d, 233f, 234d, 243f, 235d, 236d and 237d, the opening/closing operation of the APC valve 243 and the pressure adjusting operation by the APC valve 243 based on the pressure sensor 248, the temperature regulating operation by the heater 218 based on the temperature sensor 274, the startup and stop of the vacuum pump 246, the rotation and rotation speed adjusting operation of the susceptor 217 by the rotation mechanism 267, the elevation operation of the susceptor 217 by the elevating instrument 268, the power supplying and stopping operation of the high-frequency power source 273 and the impedance adjusting operation by the matching device 272, and so on.

Moreover, the controller 300 is not limited to being configured as a dedicated computer but may be configured as a general-purpose computer. For example, the controller 300 according to the present embodiment may be configured by preparing an external memory device 303 (e.g., a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer through the use of the external memory device 303. In addition, a means for supplying the program to a computer is not limited to the case in which the program is supplied through the external memory device 303. For example, the program may be supplied using a communication means such as the Internet or a dedicated line, rather than through the external memory device 303. Also, the memory device 301c or the external memory device 303 is configured as a non-transitory computer-readable recording medium. Hereinafter, these means for supplying the program will be simply referred to as "a recording medium." In addition, when the term "recording medium" is used herein, it may include a case in which only the memory device 301c is included, a case in which only the external memory device 303 is included, or a case in which both the memory device 301c and the external memory device 303 are included.

(5) Substrate Processing Process

As one process of a semiconductor device manufacturing method, a process of forming a film on the wafers 200 using the above-configured substrate processing apparatus 10 will be described. In the following description, operations of various components of the substrate processing apparatus 10 are controlled by the controller 300.

Here, an example of forming a TiN film on the wafers 200 using a $TiCl_4$ gas as the precursor gas (first processing gas) and an $NH_3$ gas as the reaction gas (second processing gas) according to the alternate supply method will be described.

Figure 8:
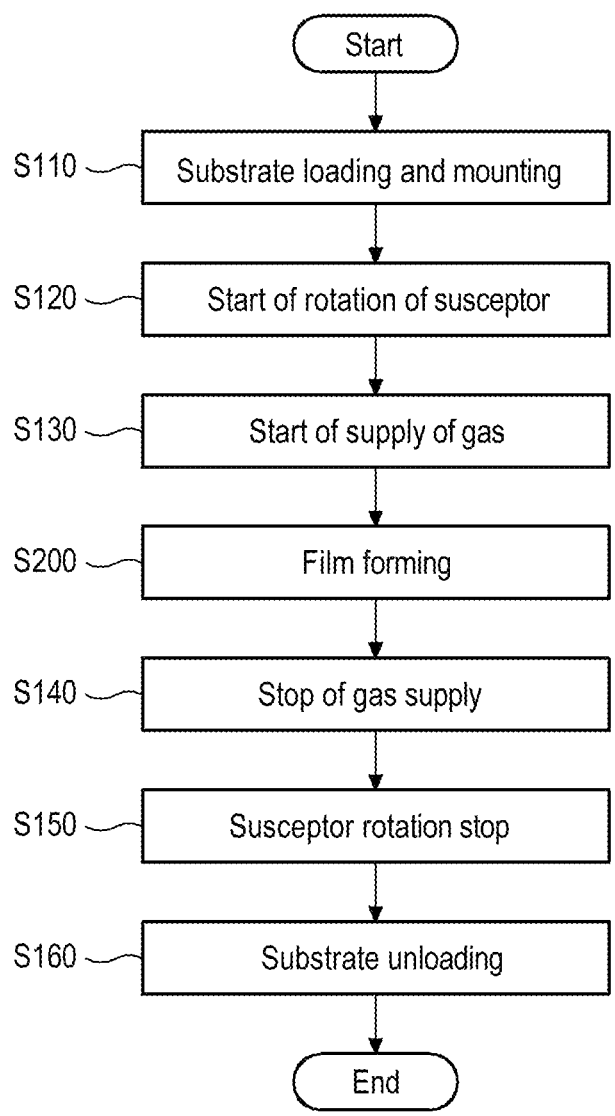
FIG. 8 is a flowchart showing a substrate processing process according to one embodiment of the present disclosure.
Figure 9:
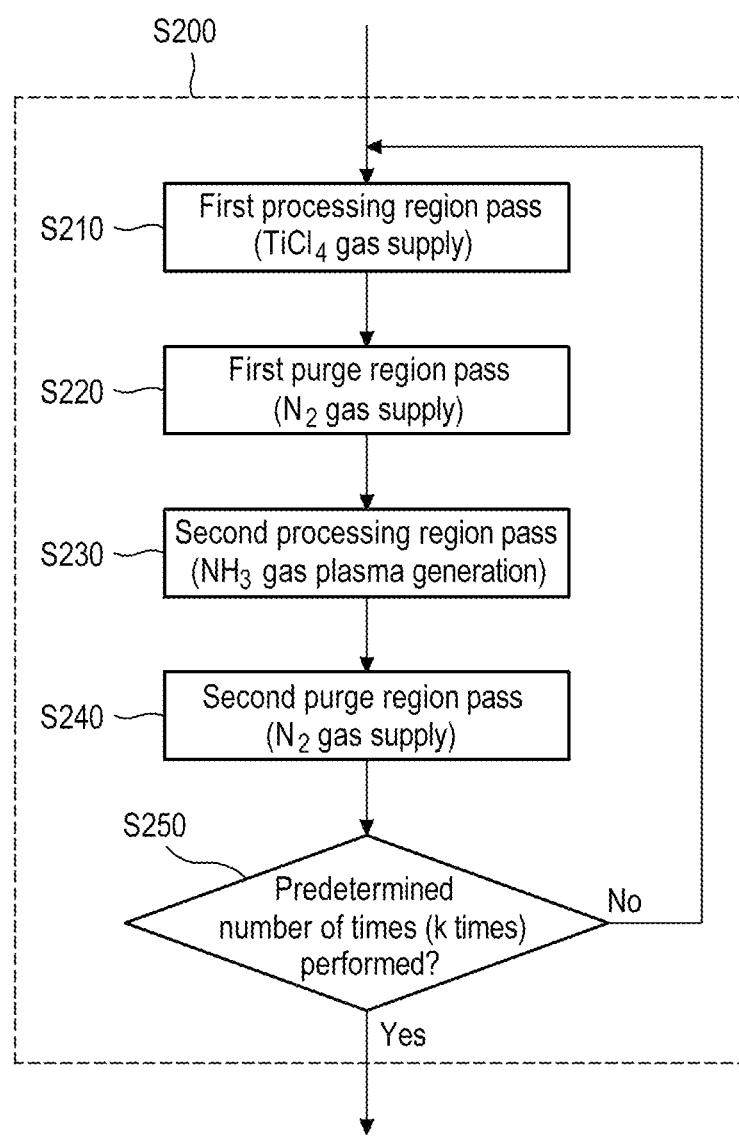
FIG. 9 is a flowchart showing a film forming process according to one embodiment of the present disclosure.

FIG. 8 is a flowchart for showing a substrate processing process according to the present embodiment. FIG. 9 is a flowchart for showing a film forming process according to the present embodiment.

(Substrate Loading and Mounting Process: S110)

In forming a film on the wafers 200, a substrate loading and mounting process (S110) is first performed in the substrate processing apparatus 10. In the substrate loading and mounting process (S110), an intra-process transfer device (not shown) mounts the pod 100 in which up to 25 wafers 200 are accommodated, on the load port 105. Then, after the cap 100a of the pod 100 is opened by the pod opener 108, the second wafer transfer device 124 picks up the wafers 200 from the pod 100, mounts them on the notch aligning device 106, and causes the notch aligning device 106 to perform positional adjustment of the wafers 200. After performing the positional adjustment of the wafers 200, the second wafer transfer device 124 loads the wafers 200 from the notch aligning device 106 into the pre-chamber 122 under the atmospheric pressure. After loading the wafers 200, the interior of the pre-chamber 122 is exhausted to a negative pressure by an exhauster (not shown) in a state where the gate valve 128 is closed.

Thereafter, in the process chamber 202, the susceptor 217 is descended to reach a transfer position of the wafers 200 so that the wafer lift pins 266 pass through the through holes 217a of the susceptor 217. As a result, the wafer lift pins 266 protrude by a predetermined height from the surface of the susceptor 217. Subsequently, the gate valves 126, 127, 150, 151, 152 and 153 are opened to communicate the process chamber 202 to the first transfer chamber 103 and the pre-chamber 122.

In this state, the first wafer transfer device 112 loads the wafers 200 in the pre-chamber 122 into the processing chamber 201 of the process chamber 202 and mounts the wafers 200 on the wafer lift pins 266 protruding from the surface of the susceptor 217. The first wafer transfer device 112 repeats this loading operation for a predetermined number of (for example, five) wafers 200. At this time, the rotation mechanism 267 rotates the susceptor 217 if necessary. Thus, in the processing chamber 201, the plurality of wafers 200 is mounted on the wafer lift pins 266 protruding from the surface of the susceptor 217 along the circumferential direction of the susceptor 217 in a non-overlapping manner.

After the wafers 200 are loaded into the processing chamber 201, the first wafer transfer device 112 is evacuated out of the process chamber 202 and then the gate valves 150, 151, 152 and 153 are closed to seal the reaction container 203. Then, the elevating instrument 268 ascends the susceptor 217. Thus, the wafers 200 are mounted on the wafer mounting tables 217b on the susceptor 217.

When the wafers 200 are loaded into the processing chamber 201, an $N_2$ gas as an inert gas may be supplied from the inert gas supply system into the processing chamber 201 while exhausting the interior of the processing chamber 201 by means of the exhaust system. That is, while exhausting the internal atmosphere of the processing chamber 201 by actuating the vacuum pump 246 to open the APC valve 243, the $N_2$ gas may be supplied into the processing chamber 201 by opening at least the valves 234d and 234f of the first inert gas supply system. Thus, it is possible to prevent introduction of particles into the processing chamber 201 and adhesion of particles to the wafers 200. The supply of the $N_2$ gas may be performed by one of the second inert gas supply system and the third inert gas supply system, or by a proper combination of these inert gas supply systems and the first inert gas supply system.

The vacuum pump 246 keeps actuated until at least the substrate loading and mounting process (S110) to a substrate unloading process (S160) to be described later are terminated. At this time, the APC valve 243 maintains the interior of the processing chamber 201 at a predetermined pressure by adjusting conductance of the exhaust pipes 231.

In addition, when the wafers 200 are mounted on the wafer mounting table 217b of the susceptor 217, electric power is supplied to the heater embedded in the susceptor 217 so that the temperature of the surfaces of the wafers 200 is controlled to reach a predetermined processing temperature. At this time, the temperature of the heater 218 is adjusted by controlling electrical conduction to the heater 218 based on the temperature information detected by the temperature sensor 249.

In this manner, in the substrate loading and mounting process (S110), the interior of the processing chamber 201 is controlled to reach the predetermined processing pressure and the temperature of the surface of the wafers 200 is controlled to reach the predetermined processing temperature. The terms "predetermined processing temperature" and "predetermined processing pressure" refer to a processing temperature and a processing pressure, respectively, at which a TiN film can be formed in a film forming process (S200) described later, but, for example, the precursor gas is not self-decomposed. Specifically, the processing temperature may be the room temperature to 500 degrees C. and, in some embodiments, the room temperature to 400 degrees C. and the processing pressure may be 50 to 5,000 Pa. These processing temperature and processing pressure are maintained even in the film forming process (S200).

(Start of Rotation of Susceptor: S120)

Following the substrate loading and mounting process (S110), the susceptor 217 starts to be rotated (S120). Specifically, when the wafers 200 are mounted on each wafer mounting table 217b, the rotation mechanism 267 rotates the susceptor 217. At this time, the rotational speed of the susceptor 217 is controlled by the controller 300. The rotational speed of the susceptor 217 may be, for example, 1 rpm to 100 rpm. Specifically, the rotational speed is, for example, 60 rpm. When the susceptor 217 is rotated, the wafers 200 start to move to the first processing region 201a, the first purge region 204a, the second processing region 201b and the second purge region 204b in this order.

(Start of Supply of Gas: S130)

After the susceptor 217 reaches a desired rotational speed, the gases start to be supplied into the first processing region 201a, the first purge region 204a, the second processing region 201b and the second purge region 204b, respectively (S130).

By opening the valve 232d of the processing chamber 201, a $TiCl_4$ gas is supplied into the first processing region 201a. At this time, the MFC 232c is adjusted to set a flow rate of the $TiCl_4$ gas to a predetermined flow rate. The flow rate of the $TiCl_4$ gas is, for example, 0.1 g/min to 2.0 g/min. Along with the $TiCl_4$ gas, an $N_2$ gas as a carrier gas may be flown from the second inert gas supply system. Thus, the $TiCl_4$ as is supplied from the line-shaped gas supply part 281 into the first processing region 201a.

By opening the valve 233d and the valve 233f, an $NH_3$ gas is supplied into the second processing region 201b. At this time, the MFC 233c is adjusted to set a flow rate of the $NH_3$ gas to a predetermined flow rate. The flow rate of the $NH_3$ as is, for example, 100 sccm to 5,000 sccm. Along with the $NH_3$ gas, an $N_2$ gas as a carrier gas may be flown from the third inert gas supply system. Thus, in parallel with the supply of the $TiCl_4$ gas into the first processing region 201a, the $NH_3$ gas is supplied from the second processing gas ejection hole 255 and the gas ejection hole in the plasma generating part 206 into the second processing region 201b.

When the supply flow rate of the $NH_3$ gas is stabilized, the plasma generating part 206 starts to generate plasma in the second processing region 201b. Specifically, while high frequency power is applied from the high-frequency power source 273 of the plasma generating part 206 to the electrodes 271, impedance is matched by the matching device 272. Thus, the plasma-excited $NH_3$ gas is supplied into the second processing region 201b.

By opening the valve 234d, an $N_2$ gas is supplied into the first purge region 204a and the second purge region 204b. At this time, the MFC 234c is adjusted to set a flow rate of the $N_2$ gas to a predetermined flow rate. The flow rate of the $N_2$ gas is, for example, 1,000 sccm to 10,000 sccm. Thus, in parallel with the supply of the $TiCl_4$ gas into the first processing region 201a and the supply of the $NH_3$ gas into the second processing region 201b, the $N_2$ gas is supplied from the line-shaped gas supply part 281b and the line-shaped gas supply part 281c into the first purge region 204a and the second purge region 204b, respectively. The $N_2$ gas may be continuously supplied into the first purge region 204a and the second purge region 204b since the $N_2$ gas starts to be supplied in the substrate loading and mounting process (S110).

(Film Forming Process: S200)

Thus, when the first processing region 201a is put under the $TiCl_4$ gas atmosphere, the second processing region 201b is put under the $NH_3$ gas atmosphere and the first purge region 204a and the second purge region 204b are put under the $NH_3$ gas atmosphere, the wafer 200 on each wafer mounting table 217h passes through the first processing region 201a, the first purge region 20'1a, the second processing region 201b and the second purge region 204b in this order so that the film forming process (S200) is performed. Here, the film forming process (S200) will be described in detail below with reference to FIG. 9.

(First Processing Region Passage: S210)

In the film forming process (S200), the wafer 200 first passes through the first processing region 201a. When passing through the first processing region 201a, the wafer 200 is exposed to the $TiCl_4$ gas atmosphere. At this time, since the atmosphere gas in the first processing region 201a is only the $TiCl_4$ gas and the inert gas, the $TiCl_4$ gas makes direct contact with the wafer 200 without reacting with the $NH_3$ gas. The processing temperature and processing pressure of the first processing region 201a are a processing temperature and a processing pressure, respectively, at which the $TiCl_4$ gas is not self-decomposed. Therefore, a Ti-containing layer containing Ti is formed on the surface of the wafer 200.

(First Purge Region Passage: S220)

After passing through the first processing region 201a, the wafer 200 enters the first purge region 204a by the rotation of the susceptor 217. When passing through the first purge region 204a, the wafer 200 is exposed to the $N_2$ gas atmosphere. Thus, the component of the $TiCl_4$ gas, which could not form a robust bonding on the wafer 200 in the first processing region 201a, is removed from the surface of the wafer 200.

(Second Processing Region Passage: S230)

After passing through the first purge region 204a, the wafer 200 enters the second processing region 201b by the rotation of the susceptor 217. When passing through the second processing region 201b, the wafer 200 is exposed to the $NH_3$ gas atmosphere. At this time, the plasmarized $NH_3$ as reacts with the Ti-containing layer formed on the wafer 200 so that a titanium nitride (TiN) film is formed in the second processing region 201b.

(Second Purge Region Passage: S240)

After passing through the second processing region 201b, the wafer 200 enters the second purge region 204b by the rotation of the susceptor 217. When passing through the second purge region 204b, the wafer 200 is exposed to the $N_2$ gas atmosphere. Thus, surplus such as reaction byproducts remaining on the surface of the wafer 200 is removed from the surface.

(Determination Process: S250)

With the first processing region passage (S210), the first purge region passage (S220), the second processing region passage (S230) and the second purge region passage (S240) as one cycle, the controller 300 determines whether or not the above-described cycle has been performed a predetermined number of times (k times: k is an integer of one or more) (S250). Specifically, the controller 300 counts the number of times by which the susceptor 217 is rotated and performs the above-described determination based on whether or not the count reaches the k times. When the cycle has been performed the predetermined of times (k times), the TiN film having a desired thickness is formed on the wafer 200. The film forming process (S200) is terminated when the cycle has been performed the predetermined number of times (k times).

(Gas Supply Stop: S140)

After the film forming process (S200) including the above-described processes (S210 to S250) is terminated, the supply of gases into at least the first processing region 201a and the second processing region 201b is stopped, as shown in FIG. 8 (S140). Specifically, after the film forming process (S200), the valves 232d, 233d and 233f are closed to stop the supply of $TiCl_4$ gas into the first processing region 201a and the supply of $NH_3$ gas into the second processing region 201b.

(Susceptor Rotation Stop: S150)

After stopping the supply of gases into the first processing region 201a and the second processing region 201b, the rotation of the susceptor 217 is stopped (S150).

(Substrate Unloading Process: S160)

Thereafter, a substrate unloading process (S160) is performed. In the substrate unloading process (S160), the elevating instrument 268 descends the susceptor 217 so that the wafer lift pins 266 protrude from the surface of the susceptor 217 to support the wafer 200 on the wafer lift pins 266. Thereafter, the gate valves 126, 127, 150, 151, 152 and 153 are opened to allow the process chamber 202 to communicate with the first transfer chamber 103 and the pre-chamber 122. The first wafer transfer device 112 unloads the wafer 200 on the wafer lift pins 266 out of the reaction container 203. The unloaded wafer 200 is accommodated in the pod 100 on the load port 105 by the second wafer transfer device 124. After unloading the wafer 200 out of the reaction container 203, the supply of $N_2$ gas as the inert gas into the processing chamber 201 by the inert gas supply system is stopped.

When the above-described substrate processing processes are performed, a TiN film is formed, as a thin film, on the wafer 200. After the substrate processing processes are terminated, a cleaning process for the interior of the processing chamber 201 may be performed by supplying a cleaning gas such as an $NF_3$ gas from the cleaning gas supply system into the processing chamber 201, if necessary.

(6) Gas Supply from Line-Shaped Gas Supply Part

Here, with respect to the above-described substrate processing processes, when gases are supplied into the regions 201a, 204a and 204b each of which includes the line-shaped gas supply part 281 installed therein, the gas flow will be described in detail.

However, in this embodiment, since the regions have substantially the same configuration, a gas flow in the first processing region 201a will be mainly described with reference to FIGS. 10, 11 and 12.

Figure 10:
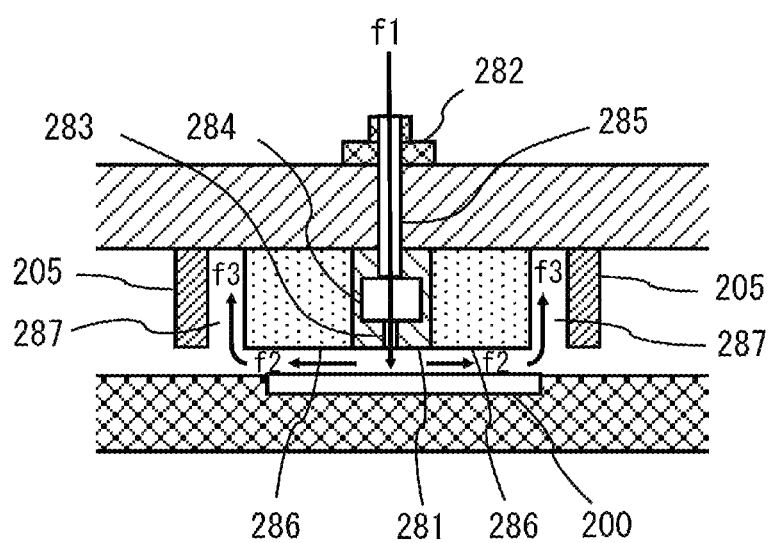
FIG. 10 is a schematic vertical sectional view showing a gas flow in a case that a gas is supplied from a line-shaped gas supply part included in a substrate processing apparatus according to one embodiment of the present disclosure.

FIG. 10 is a schematic vertical sectional view showing a gas flow in a case where a gas is supplied from the line-shaped gas supply part 281 in this embodiment. FIGS. 11 and 12 are schematic horizontal sectional views showing a gas flow in a case where a gas is supplied from the line-shaped gas supply part 281 in this embodiment.

(Gas Ejection from Opening Portion)

To supply a gas into the first processing region 201a using the line-shaped gas supply part 281, a gas that is supplied into the first processing gas supply part 282 is ejected through the opening portion 283 into the first processing region 201a via the gas supply connection pipe 285 and the gas buffer region 284, as shown in FIG. 10 (see an arrow f1).

At this time, the flow of gas is ejected through the opening portion 283 via the gas buffer region 284. The gas buffer region 284 is formed to be larger in size than the opening portion 283, when viewed from the plane, and thus functions as a gas diffusion space. Therefore, since the gas flow is ejected through the opening portion 283 after being diffused in the entire gas buffer region 284 along the radial direction of the susceptor 217, an ejection flow rate and an ejection pressure can be uniformized in the radial direction of the susceptor 217. Accordingly, it is possible to prevent the gas flow ejected through the opening portion 283 from being concentrated on a particular position (for example, a position near the connection site of the gas supply connection pipe 285).

(Gas Flow on Wafer Surface)

Figure 11:
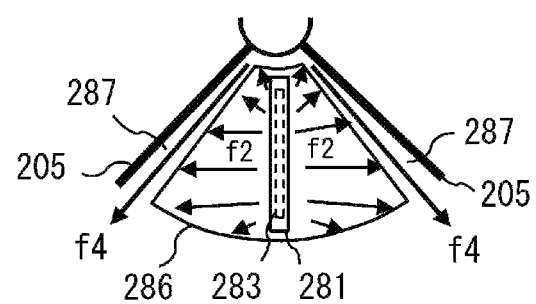
FIG. 11 is a (first) schematic horizontal sectional view showing a gas flow in a case that a gas is supplied from a line-shaped gas supply part included in a substrate processing apparatus according to one embodiment of the present disclosure.
Figure 12:
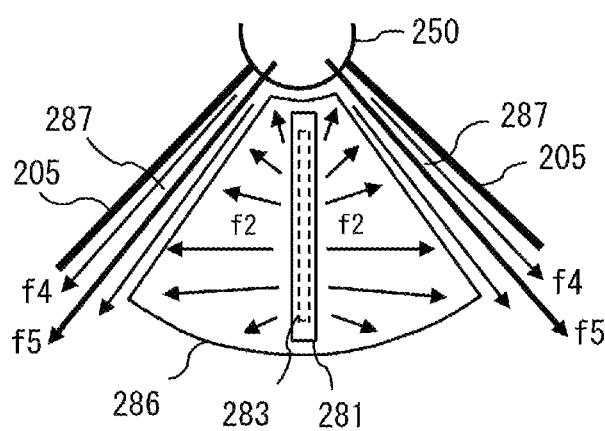
FIG. 12 is a (second) schematic horizontal sectional view showing a gas flow in a case that a gas is supplied from a line-shaped gas supply part included in a substrate processing apparatus according to one embodiment of the present disclosure.

Thereafter, the gas flow ejected from the opening portion 283 spreads over the first processing region 201a through the gap between the surface of the wafer 200 on the susceptor 217 and the bottom of the gap holding member 286, as shown in FIGS. 10 and 11 (see an arrow f2).

At this time, the gas flow spreading over the first processing region 201a is mainly flown in a direction (i.e., the circumferential direction of the susceptor 217) perpendicular to the longitudinal direction (i.e., the radial direction of the susceptor 217) in which the opening portion 283 extends. Moreover, since the original gas flow from the opening portion is uniformized in the radial direction of the susceptor 217 as described above, the gas flow spreading over the first processing region 201a has a reduced pressure difference between the rotation central side and outer peripheral side of the susceptor 217.

In addition, since the gas flow supplied into the first processing region 201a is ejected from the opening portion 283 formed in an elongated line shape, the flow is accelerated by the Venturi effect at the opening portion 283. In addition, since the opening portion 283 ejects the gas at a close distance from the wafer 200, a fast and high pressure gas reaches the wafer 200 immediately below the opening portion 283. The gas reaching the wafer 200 mainly spreads in the circumferential direction of the susceptor 217 from immediately below the opening portion 283, as described above. The gap holding member 286 is installed around the line-shaped gas supply part 281 and the space on the surface of the wafer 200 is narrowed by the gap holding member 286 so that a space between the surface of the wafer 200 and the bottom of the gap holding member 286 is maintained at a gap of a predetermined distance. Therefore, the gas flow mainly spreading in the circumferential direction of the susceptor 217 from immediately below the opening portion 283 passes through the gas passage narrowed by the gap holding member 286 and spreads quickly over the first processing region 201a. That is, as the gap holding member 286 narrows the sectional area of the gas passage, the gas flow supplied into the first processing region 201a spreads over the entire first processing region 201.a with efficiency, while maintaining a flow velocity of the gas flow ejected from the opening portion 283. In this embodiment, the gap holding member 286 is preferably installed in a manner such that the gap holding member 286 adjoins the line-shaped gas supply part 281.

In the first processing region 201a over which the gas flow spreads, the wafer 200 on the susceptor 217 is moved. At this time, since the gap holding member 286 is installed around the line-shaped gas supply part 281 in the processing region 201a, the gas flow is not diffused toward the ceiling of the processing chamber 201, contrary to a case where the gap holding member 286 is not present. That is, in the first processing region 201a, the gas flow always flows near the surface of the wafer 200. Accordingly, in the first processing region 201a, the wafer 200 moving within the region is sufficiently exposed to the gas flow.

In order to ensure the efficient spread and sufficient exposure of gas as described above, in some embodiments, the gap holding member 286 installed around the line-shaped gas supply part 281 may be, at least partially or entirely, formed to be wider than the line-shaped gas supply part 281 in the circumferential direction of the susceptor 217 to cover most of the first processing region 201a except the line-shaped gas supply part 281 and the gas discharge region 287 when viewed from the plane.

In addition, the gap holding member 286 may be formed as a separate member different from the member constituting the ceiling of the processing chamber 201. When using the separate member, it is allowed to adjust the size of the gap between the surface of the wafer 200 serving as a gas passage and the bottom of the gap holding member 286, for example by preparing different kinds of gap holding members 286. In this case, the gap holding member 286 may be detachably fixed to the ceiling of the processing chamber 201 by means of a well-known fastening member, such as screws. In addition, although, in this embodiment, the line-shaped gas supply part 281 and the gap holding member 286 are installed as different members, the line-shaped gas supply part 281 and the gap holding member 286 may be integrally formed.

(Gas Flow in Gas Discharge Region)

The gas flow ejected from the opening portion 283 mainly spreads in the circumferential direction of the susceptor 217 from immediately below the opening portion 283 to reach the gas discharge region 287 in the end. The gas discharge region 287 is a space whose upper side is defined by the ceiling of the processing chamber 201 and serves to allow the space on the surface of the wafer 200 to be wider than a portion immediately below the gap holding member 286. Therefore, when the gas moves into the gas discharge region 287, the gas flow reaching the gas discharge region 287 has conductance that is larger than conductance at a gap under the partitioning plate 205. Accordingly, the gas is diffused into the gas discharge region 287, without entering into a different adjacent region beyond the partitioning plate 205, and temporarily stays in the gas discharge region 287, as shown in FIG. 10 (see an arrow f3).

At this time, in the first processing region 201a, a gas is exhausted through the exhaust port 230 installed near the outer edge of the susceptor 217 and accordingly, a gas flow is formed from the rotation central side toward outer peripheral side of the susceptor 217. However, in the first processing region 201*a*, due to an area difference of the spaces on the surface of the wafer 200, the conductance in the gas discharge region 287 is larger than conductance at a portion immediately below the gap holding member 286. Therefore, the gas flow from the rotation central side toward outer peripheral side of the susceptor 217 in the first processing region 201*a* is mainly formed in the gas discharge region 287, as shown in FIG. 11 (see an arrow 14). This gas flow causes the gas, which enters the gas discharge region 287 from the portion immediately below the gap holding member 286 and stays there, to flow from the rotation central side toward outer peripheral side of the susceptor 217 and be exhausted through the exhaust port 230 out of the processing chamber 201.

In addition, since the gas flow formed in the gas discharge region 287 changes a direction of the gas flow entering from the portion immediately below the gap holding member 286, it contributes to prevent the gas flow introduced from the portion immediately below the gap holding member 286 from entering a different adjacent region beyond the partitioning plate 205. From this viewpoint, in some embodiments, the gas discharge region 287 may be disposed along the walls of the partitioning plates 205.

In addition, the gas discharge region 287 is not necessarily disposed along both partitioning plates 205, but may be disposed at least in the downstream side of the susceptor 217 in the rotation direction. In the upstream side of the opening portion 283 of the line-shaped gas supply part 281 in the rotation direction of the susceptor 217, the direction of the gas flow flowing through the portion immediately below the gap holding member 286 is opposite to the direction of movement of the wafer 200 when the susceptor 217 is rotated. Therefore, the momentum of the gas flow is reduced by the movement of the wafer 200, and, for example, even if the gas discharge region 287 is not disposed in the upstream side of the susceptor 217 in the rotation direction, the gas flow is exhausted out of the processing chamber 201 without entering into a different adjacent region beyond the partitioning plate 205. In addition, more gas tends to be flown out of the downstream side of the opening portion 283 of the line-shaped gas supply part 281 in the rotation direction of the susceptor 217 than the upstream side, from the relationship with the rotation direction of the susceptor 217. Even in this case, if the gas discharge region 287 is disposed at least in the downstream side of the susceptor 217 in the rotation direction, much gas flown into the region 287 can be actively exhausted out of the processing chamber 201.

(Use of Inert Gas Flow)

By the way, when the gas discharge region 287 is disposed to exhaust the gas from the first processing region 201*a*, it may be considered to form an inert gas flow in the gas discharge region 287 to use the inert gas flow to promote the gas exhaust from the first processing region 201*a* and prevent the gas from entering a different adjacent region.

Specifically, in accordance with the gas supply from the line-shaped gas supply part 281, the valve 234*f* in the first inert gas supply system is opened to eject an inert gas from the inert gas ejection hole 254 via the inert gas supply part 253 of the gas supply part 250. The inert gas ejection hole 254 is located at the rotation central side of the susceptor 217 in the gas discharge region 287. Accordingly, when the inert gas is ejected from the inert gas ejection hole 254, the inert gas flows through the gas discharge region 287 toward the outer peripheral side of the susceptor 217. Thus, a forced inert gas flow is formed in the gas discharge region 287, as shown in FIG. 12 (see an arrow f5).

When the forced inert gas flow is formed in the gas discharge region 287, a gas flow of the gas staying in the gas discharge region 287 toward the outer peripheral side of the susceptor 217 is accordingly induced (see the arrow f4). That is, by forming the forced inert gas flow in the gas discharge region 287, the exhaust of the gas supplied into the first processing region 201*a* out of the processing chamber 201 is promoted. Accordingly, using the forced inert gas flow in the gas discharge region 287, the exhaust of the gas out of the first processing region 201*a* can be performed with efficiency and reliability. Further, when using the forced inert gas flow in the gas discharge region 287, it is possible to effectively prevent the gas from entering a different adjacent region than a case where the forced inert gas flow is not used.

In addition, when the forced inert gas flow is formed in the gas discharge region 287, the flow rate and pressure of the inert gas flow may be appropriately adjusted by appropriately setting, for example, the size of the inert gas ejection hole 254. However, specific values of the flow rate and pressure of the inert gas flow are not particularly limited, as long as the gas exhaust is effectively promoted than the case where the inert gas flow is not used, but may be appropriately set in consideration of the size of the first processing region 201*a*, the size of the gas discharge region 287 and the like.

(7) Effects of Embodiment

One or more advantages may be achieved as follows.

(a) According to an embodiment, in the process chamber 202 configured as a multi-wafer device of a substrate revolution type, in each of the first processing region 201*a*, the first purge region 204*a* and the second purge region 204*b*, the line-shaped gas supply part 281 for supplying a gas through the line-shaped opening portion 283 into the corresponding region and the gap holding member 286 disposed therearound are installed in the corresponding region. Accordingly, in each region, a high pressure gas is uniformly ejected in the radial direction of the susceptor 217 with a high velocity onto the surface of the wafer 200. The ejected gas in the radial direction spreads over entire of the region with efficiency and with the high velocity so that the wafer 200 moving through the region can be sufficiently exposed to the gas flow. That is, according to the present embodiment, in each region, a high level of exposure of gas can uniformly achieved onto the wafer 200 to be processed. In addition, in each region, since the supplied gas spreads with efficiency, it takes long time neither to supply or exhaust the gas into or out of the region, nor to cause the gas to be widely spread over the surface of the wafer 200 so that a film is allowed to be formed on the surface of the wafer 200 with a high throughput. That is, according to this embodiment, in each region, it is possible to process the wafer 200 with a high throughput.

(b) In addition, according to this embodiment, the gap holding member 286 is, at least partially or entirely, formed to be wider than the line-shaped gas supply part 281 in the circumferential direction of the susceptor 217. That is, when comparing the line-shaped gas supply part 281 with the gap holding member 286, the line-shaped gas supply part 281 is relatively narrow and the gap holding member 286 is relatively wide. Accordingly, since the opening portion 283 in the line-shaped gas supply part 281 is also relatively narrow, the gas can be ejected with a high pressure from the opening portion 283. Further, since the gap holding member 286 is relatively wide, the gas ejected from the opening portion 283 can spread with the high pressure and a high velocity so that the gas can be intensively ejected near the surface of the wafer 200. As a result, in the present embodiment, it is possible to supply the gas with a high level of exposure onto the surface of the wafer 200. With the high level of exposure of the gas, it is possible to facilitate faster rotation of the susceptor 217, which is highly effective in processing of the wafer 200 with a high throughput.

(c) In addition, according to this embodiment, the gas discharge region 287 along the partitioning plate 205 is formed in each of the first processing region 201a, the first purge region 204a and the second purge region 204b, respectively including the line-shaped gas supply part 281. Therefore, in each region, a gas reaching the gas discharge region 287 can be fast discharged out of the region through the gas discharge region 287. In addition, since the gas is actively released toward the outer peripheral side of the susceptor 217 through the gas discharge region 287, it is possible to prevent the gas flow from entering a different adjacent region beyond the partitioning plate 205. This is highly effective to achieve the fast rotation of the susceptor 217 and contributes to a high throughput of the processing of the wafer 200.

(d) In addition, as described in this embodiment, the gas discharge region 287 may be disposed at least in the downstream side of the susceptor 217 in the rotation direction, but may be also disposed along both partitioning plates 205 in each region. This is because the gas discharge region 287 at the downstream side of the susceptor 217 in the rotation direction has higher contribution to the exhaust of the gas out of the region.

(e) In addition, according to this embodiment, the line-shaped gas supply part 281 encloses the gas buffer region 284 in the upstream side of the opening portion 283 in the gas supply direction. Accordingly, even when the opening portion 283 is formed in a line shape extending in the radial direction of the susceptor 217, the ejection flow rate and pressure of the gas flow ejected from the opening portion 283 can be uniformized in the radial direction of the susceptor 217, thereby preventing the gas flow from being concentrated on a particular position.

(f) In addition, according to this embodiment, in each of the first processing region 201a, the first purge region 204a and the second purge region 204b, the exhaust port 230 is formed near the outer edge of the susceptor 217 and the inert gas election holes 254, 256 and 257 connected to the inert gas supply system are formed in the gas supply part 250 located at the rotation central side of the susceptor 217. Accordingly, when a forced inert gas flow is formed in the gas discharge region 287 by ejecting an inert gas from the inert gas ejection holes 254, 256 and 257, the exhaust of gas from the region can be performed with efficiency and reliability. Further, when using the forced inert gas flow in the gas discharge region 287, it is possible to effectively prevent the gas from entering a different adjacent region than a case where forced inert gas flow is not used.

Other Embodiments of the Present Disclosure

The embodiment of the present disclosure has been described in detail. However, the present disclosure is not limited to the foregoing embodiment, but may be variously modified without departing from the spirit of the present disclosure.
(Number of Line-Shaped Gas Supply Parts Installed in Region)

Although it has been illustrated in the above embodiment that only one line-shaped gas supply part 281 is installed in each of the first processing region 201a, the first purge region 204a and the second purge region 204b, the present disclosure is not limited thereto, but a plurality of line-shaped gas supply parts 281 may be installed in parallel (including radially in parallel) in each region.

When the plurality of line-shaped gas supply parts 281 is installed in parallel in each region, since the gas is supplied from each opening portion 283 formed in each line-shaped gas supply part 281 into the region, it is possible to supply the gas with higher efficiency than the above described embodiment, which can result in processing of the wafer 200 with a higher throughput.

In addition, when the plurality of line-shaped gas supply parts 281 is installed in parallel in each region, the opening portions 283 formed in the line-shaped gas supply parts 281 may be disposed radially around the rotary shaft of the susceptor 217. For example, if the line-shaped gas supply parts 281 are arranged such that the opening portions 283 formed in the line-shaped gas supply parts 281 are in parallel to each other, in a compact process chamber 202, a difference in gas exposure to the wafer 200 may be caused between the inner peripheral side and the outer peripheral side, in relation with the rotation of the susceptor 217. However, when the opening portions 283 formed in the line-shaped gas supply parts 281 are disposed radially, the gas exposure to the wafer 200 in the inner peripheral side and the outer peripheral side can be uniformized. In addition to the configuration of having the plurality of the line-shaped gas supply parts 28 in the region as described above, the plurality of line-shaped opening portions may be formed in parallel in one line-shaped gas supply part 281.
(Position where Inert Gas Ejection Hole Installed)

In addition, although it has been illustrated the embodiment as described above that the inert gas is ejected from the inert gas ejection holes 254, 256 and 257 of the gas supply part 250 located at the rotation central side of the susceptor 217 to form the inert as flow in the gas discharge region 287, the present disclosure is not limited thereto. That is, for example, the inert gas ejection holes 254, 256 and 257 for ejecting the inert gas may be installed in the ceiling of the processing chamber 201. However, in this case, the wafer 200 moves between the position where the inert gas ejection holes 254, 256 and 257 are installed and the outer periphery of the susceptor 217, when viewed from the plane.
(Number of Partitioned Regions in Processing Chamber)

In addition, although it has been illustrated in the above embodiment that the interior of the processing chamber 201 is partitioned to the first processing region 201a, the first purge region 204a, the second processing region 201b and the second purge region 204b by the four partitioning plates 205, the present disclosure is not limited thereto. That is, the present disclosure may be applied to a substrate processing apparatus 10 including a processing chamber 201 having at least the four regions. Accordingly, in addition to these four regions, the interior of the processing chamber 201 of the substrate processing apparatus 10 to which the present disclosure is applied may further include a region where a film formed on the wafer 200 is modified by supplying a modifying gas, such as $H_2$ gas. In addition, although it has been illustrated in the above embodiment that the interior of the processing chamber 201 is equally partitioned into the regions, the present disclosure is not limited thereto, but the interior of the processing chamber 201 may be partitioned into regions having different sizes.
(Installation Region of Line-Shaped Gas Supply Part)

It has been illustrated in the above embodiment that the line-shaped gas supply part 281a is installed in the first processing region 201a, the line-shaped gas supply part 281b is installed in the first purge region 204a, and the line-shaped gas supply part 281c is installed in the second purge region 204b. As such, when the line-shaped gas supply part 281a is installed in the first processing region 201a, since the precursor gas can be sufficiently supplied onto the wafer 200, a proper film forming process can be performed even when the rotational speed of the susceptor 217 is increased to reduce film forming time. In addition, when the line-shaped gas supply part 281b and the line-shaped gas supply part 281c are respectively installed in the first purge region 204a and the second purge region 204b, since the inert gas can be sufficiently supplied onto the wafer 200, a unreacted residual gas on the wafer 200 can be quickly and appropriately removed even when the rotational speed of the susceptor 217 is increased.

However, the present disclosure is not limited thereto, but the line-shaped gas supply part 281 may be installed in at least one of the first processing region 201a, the first purge region 204a and the second purge region 204b. In addition, even when the interior of the processing chamber 201 includes the modifying gas supply region as described above, the line-shaped gas supply part 281 may be installed in the modifying gas supply region.

In addition, in the above embodiment, since at least a portion of the plasma generating part 206 is installed in the second processing region 201b, the line-shaped gas supply part 281 is not installed in the second processing region 201b. However, if a reaction gas, which can be sufficiently plasma-excited by a remote plasma generating part without using the plasma generating part 206, is supplied, the line-shaped gas supply part 281 may be installed in the second processing region 201b so that the plasmarized reaction gas is supplied through the line-shaped gas supply part 281. That is, in the present disclosure, the line-shaped gas supply part 281 may be installed in the second processing region 201b.

(Gas Species)

In addition, although it has been illustrated the above embodiment that, in the film forming process performed by the substrate processing apparatus 10, the $TiCl_4$ gas is used as the precursor gas (first processing gas), the $NH_3$ gas is used as the reaction gas (second processing gas), and the TIN film is formed on the wafer 200 by supplying these gases alternately, the present disclosure is not limited thereto. That is, the processing gases used for the film forming process are not limited to the $TiCl_4$ gas and the $NH_3$ gas, but different kinds of gases may be used to form different types of films. Further, the present disclosure can be applied, even when three or more kinds of processing gases are used, as long as these gases can be alternately supplied to perform the film forming process.

(Partitioning Plate)

In addition, it has been illustrated in the above embodiment that the four partitioning plates 205 are installed as partitioning parts for partitioning the processing chamber 201 into the first processing region 201a, the first purge region 204a, the second processing region 201b and the second purge region 204b. However, the present disclosure is not limited thereto, but other structures for partitioning the processing chamber 201 into regions, such as block-like members, gas supply nozzles, gas exhaust nozzles and the like, may be installed as partitioning parts.

(Others)

In addition, although it has been illustrated in the above embodiment that the substrate processing apparatus 10 performs the film forming process, the present disclosure is not limited thereto. That is, in addition to the film forming process, the substrate processing apparatus 10 may perform a process of forming an oxide film or a nitride film, a process of forming a film including metal, and the like. In addition, the substrate processing may be appropriately, without any limitation, applied to not only the film firming process, but also other substrate processing, such as annealing, oxidation, nitridation, diffusion, lithographic processing, and so on. In addition, the present disclosure can be appropriately applied to other substrate processing apparatuses, such as an annealing apparatus, an oxidization apparatus, a nitridation apparatus, an exposure apparatus, a coating apparatus, a drying apparatus, a heater, a processing apparatus using plasma, and so on. In addition, the present disclosure may include combinations of these apparatuses. In addition, elements of one embodiment may be partially replaced with and added to elements of other embodiments. In addition, some of elements of each embodiment may be added to, deleted, or replaced with other elements.

<Aspects of the Present Disclosure>

Hereinafter, some supplementary aspects of the present disclosure will be stated.

(Supplementary Note 1)

According to an aspect of the present disclosure, there is provided a substrate processing apparatus, including:

a processing chamber having a first processing region under a first processing gas atmosphere and a second processing region under a second processing gas atmosphere;

a substrate mounting table on which a substrate to be processed is mounted, the substrate mounting table being rotatably installed in the processing chamber; and a rotation instrument configured to rotate the substrate mounting table such that the substrate passes through the first processing region and the second processing region in this order, wherein at least one of the first processing region and the second processing region includes: a line-shaped gas supply part that includes a line-shaped opening portion extending in a radial direction of the substrate mounting table and is configured to supply a gas from the opening portion into the at least one region; and a gap holding member that protrudes from a ceiling of the processing chamber opposing the substrate, around the line-shaped gas supply part or the opening portion, toward the substrate such that a space on a surface of the substrate has a gap of a predetermined distance, the space serving as a passage of the gas supplied by the line-shaped gas supply part.

(Supplementary Note 2)

The substrate processing apparatus according to Supplementary Note 1, wherein at least a portion of the gap holding member, which forms a gap holding unit, is formed to be wider than the line-shaped gas supply part in a circumferential direction of the substrate mounting table.

(Supplementary Note 3)

The substrate processing apparatus according to Supplementary Note 1 or 2, wherein a partitioning unit is installed in the processing chamber to partition the processing chamber into the first processing region and the second processing region, and wherein the at least one region includes a gas discharge region that is a space defined by the surface of the substrate and the ceiling of the processing chamber between the partitioning unit and the gap holding member.

(Supplementary Note 4)

The substrate processing apparatus according to Supplementary Note 3, wherein the gas discharge region is disposed at least in a downstream side of the opening portion in a rotation direction of the substrate mounting table.

(Supplementary Note 5)

The substrate processing apparatus according to any one of Supplementary Notes 1 to 4, wherein a plurality of line-shaped gas supply parts or a plurality of opening portions is disposed adjacent to each other in the at least one region.

(Supplementary Note 6)

The substrate processing apparatus according to Supplementary Note 5, wherein the plurality of line-shaped gas supply parts or the plurality of opening portions is disposed radially around a rotary shaft of the substrate mounting table.

(Supplementary Note 7)

The substrate processing apparatus according to any one of Supplementary Notes 1 to 6, wherein the line-shaped gas supply part includes a gas buffer region that is formed in an upstream side of the opening portion in a gas supply direction to extend in the radial direction of the substrate mounting table, the gas buffer region serving as a gas diffusion space.

(Supplementary Note 8)

The substrate processing apparatus according to Supplementary Note 3 or 4, wherein a gas exhaust system that is configured to exhaust a gas from the processing chamber to an outer peripheral side of the substrate mounting table and is connected to the processing chamber, and wherein an inert gas supply system that is configured to supply an inert gas flowing in the gas discharge region from a rotation central side of the substrate mounting table toward the outer peripheral side thereof and is connected to the processing chamber.

(Supplementary Note 9)

According to another aspect of the present disclosure, there is provided a method of manufacturing a semiconductor device or a method of processing a substrate, including:

mounting a substrate on a substrate mounting table installed in a processing chamber having a first processing region and a second processing region; and processing the substrate by rotating the substrate mounting table such that the substrate passes through the first processing region and the second processing region in this order, under a state where the first processing region is put under a first processing gas atmosphere and the second processing region is put under a second processing gas atmosphere, wherein at least one of the first processing region and the second processing region includes: a line-shaped gas supply part including a line-shaped opening portion extending in a radial direction of the substrate mounting table; and a gap holding member that protrudes from a ceiling of the processing chamber opposing the substrate, around the line-shaped gas supply part or the opening portion, toward the substrate such that a space on the surface of the substrate has a gap of a predetermined distance, wherein the processing further includes supplying a gas from the opening portion into the at least one region, the space defined by the gap holding member serving as a passage of the gas supplied from the opening portion of the line-shaped gas supply part.

(Supplementary Note 10)

According to another aspect of the present disclosure, there is provided a method of manufacturing a semiconductor device or a method of processing a substrate, including:

mounting a substrate to be processed on a substrate mounting table installed in a processing chamber having a first processing region, a second processing region and a purge region interposed between the first processing region and the second processing region; and processing the substrate by rotating the substrate mounting table such that the substrate passes through the first processing region, the purge region, the second processing region and the purge region in this order, under a state where the first processing region is put under a first processing gas atmosphere, the second processing region is put under a second processing gas atmosphere, and the purge region is put under an inert gas atmosphere, wherein the processing further includes supplying a gas into at least one of the first processing region, the second processing region and the purge region, the at least one of the first processing region, the second processing region and the purge region including a line-shaped gas supply part having a line-shaped opening portion extending in a radial direction of the substrate mounting table, the gas being supplied from the line-shaped gas supply part into the at least one region, and wherein the gas supplied from the line-shaped gas supply part in the at least one region flows through a gap that is formed by a gap holding member disposed in the at least one region to protrude from a ceiling of the processing chamber opposing the substrate, around the line-shaped gas supply part or the opening portion, toward the substrate such that a space on the surface of the substrate has a gap of a predetermined distance.

According to the present disclosure, it is possible to uniformly supply a high level of exposure of gas onto a substrate and perform a process with a high throughput.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a processing chamber having a first processing region and a second processing region;
a substrate mounting table on which a substrate to be processed is mounted, the substrate mounting table being rotatably installed in the processing chamber; and
a rotator configured to rotate the substrate mounting table such that the substrate passes through the first processing region and the second processing region in this order,
wherein at least one region of the first processing region and the second processing region includes:
a gas supply part installed in a ceiling of the processing chamber and that is configured to supply a gas into the at least one region, and includes:
a gas buffer region extending in a radial direction of the substrate mounting table and serving to diffuse the gas; and
a line-shaped opening portion formed in the gas supply part at a downstream side of a flow of the gas from the gas buffer region, extending in the radial direction of the substrate mounting table, and serving to eject the gas into the at least one region; and a gap holding member that protrudes from the ceiling of the processing chamber opposing the substrate, around the line-shaped opening portion, toward the substrate such that a space on a surface of the substrate has a gap of a predetermined distance, and extends in a circumferential direction and the radial direction of the substrate mounting table, the space serving as a passage of the gas supplied by the gas supply part, wherein a size of the gas buffer region is larger than a size of the line-shaped opening portion when viewed from a plane, wherein the line-shaped opening portion is disposed on a bottom side of the gas buffer region facing with the substrate so that the gas buffer region is directly communicated with the at least one region, wherein the gap holding member is formed to be wider than the gas supply part in the circumferential direction, wherein a partitioning unit is installed in the processing chamber to partition the processing chamber into at least the first processing region and the second processing region, the partitioning unit including a plurality of radially extending members to block a space from the ceiling of the processing chamber to just above the substrate mounting table, wherein the at least one region further includes a gas discharge region that is a space defined by the surface of the substrate and the ceiling of the processing chamber, between the partitioning unit and the gap holding member, and wherein the gap holding member is formed as a separate member different, from a member constituting the ceiling of the processing chamber and detachably fixed to the ceiling of the processing chamber.

2. The substrate processing apparatus of claim 1, wherein the gas discharge region is disposed at least in a downstream side of the line-shaped opening portion in a rotation direction of the substrate mounting table.

3. The substrate processing apparatus of claim 1, wherein the gas discharge region is disposed in a downstream side of the line-shaped opening portion in a rotation direction of the substrate mounting table and is not disposed in an upstream side thereof.

4. The substrate processing apparatus of claim 1, wherein a gas exhaust system comprising a vacuum pump that is configured to exhaust the gas from the processing chamber to an outer peripheral side of the substrate mounting table and is connected to the processing chamber, and wherein an inert gas supply system comprising a tubular inert gas supplying part that is configured to supply an inert gas flowing in the gas discharge region from a rotation central side of the substrate mounting table toward the outer peripheral side thereof and is connected to the processing chamber.

5. The substrate processing apparatus of claim 1, wherein the gap holding member adjoins the gas supply part.

6. The substrate processing apparatus of claim 1, wherein the gas supply part and the gap holding member are integrally formed.

7. A method of manufacturing a semiconductor device, comprising:

mounting a substrate on a substrate mounting table installed in a processing chamber having a first processing region and a second processing region; and processing the substrate by rotating the substrate mounting table such that the substrate passes through the first processing region and the second processing region in this order, under a state where the first processing region is put under a first processing gas atmosphere and the second processing region is put under a second processing gas atmosphere, wherein at least one region of the first processing region and the second processing region includes:

a gas supply part installed in a ceiling of the processing chamber and that is configured to supply a gas into the at least one region, and includes:

a gas buffer region extending in a radial direction of the substrate mounting table and serving to diffuse the gas; and a line-shaped opening portion, formed in the gas supply part at a downstream side of a flow of the gas from the gas buffer region, extending in the radial direction of the substrate mounting table, and serving to eject the gas into the at least one region; and a gap holding member that protrudes from the ceiling of the processing chamber opposing the substrate, around the line-shaped opening portion, toward the substrate such that a space on a surface of the substrate has a gap of a predetermined distance, and extends in a circumferential direction and the radial direction of the substrate mounting table, the space serving as a passage of the gas supplied by the gas supply part, wherein a size of the gas buffer region is larger than a size of the line-shaped opening portion when viewed from a plane, wherein the line-shaped opening portion is disposed on a bottom side of the gas buffer region facing with the substrate so that the gas buffer region is directly communicated with the at least one region, wherein the gap holding member is formed to be wider than the gas supply part in the circumferential direction, and wherein a partitioning unit is installed in the processing chamber to partition the processing chamber into at least the first processing region and the second processing region, the partitioning unit including a plurality of radially extending members to block a space from the ceiling of the processing chamber to just above the substrate mounting table, wherein the at least one region further includes a gas discharge region that is a space defined by the surface of the substrate and the ceiling of the processing chamber between the partitioning unit and the gap holding member, and wherein the gap holding member is formed as a separate member different, from a member constituting the ceiling of the processing chamber and detachably fixed to the ceiling of the processing chamber.

8. A method of processing a substrate, comprising:

mounting the substrate on a substrate mounting table installed in a processing chamber having a first processing region and a second processing region; and processing the substrate by rotating the substrate mounting table such that the substrate passes through the first processing region and the second processing region in this order, under a state where the first processing region is put under a first processing gas atmosphere and the second processing region is put under a second processing gas atmosphere, wherein at least one region of the first processing region and the second processing region includes:

a gas supply part installed in a ceiling of the processing chamber and that is configured to supply a gas into the at least one region, and includes:

a gas buffer region extending in a radial direction of the substrate mounting table and serving to diffuse the gas; and a line-shaped opening portion, formed in the gas supply part at a downstream side of a flow of the gas from the gas buffer region, extending in the radial direction of the substrate mounting table, and serving to eject the gas into the at least one region; and a gap holding member that protrudes from the ceiling of the processing chamber opposing the substrate, around the line-shaped opening portion, toward the substrate such that a space on a surface of the substrate has a gap of a predetermined distance, and extends in a circumferential direction and the radial direction of the substrate mounting table, the space serving as a passage of the gas supplied by the gas supply part, wherein a size of the gas buffer region is larger than a size of the line-shaped opening portion when viewed from a plane, wherein the line-shaped opening portion is disposed on a bottom side of the gas buffer region facing with the substrate so that the gas buffer region is directly communicated with the at least one region, wherein the gap holding member is formed to be wider than the gas supply part in the circumferential direction, and wherein a partitioning unit is installed in the processing chamber to partition the processing chamber into at least the first processing region and the second processing region, the partitioning unit including plurality radially extending members to block a space from the ceiling of the processing chamber to just above the substrate mounting table, wherein the at least one region further includes a gas discharge region that is a space defined by the surface of the substrate and the ceiling of the processing chamber between the partitioning unit and the gap holding member, and wherein the gap holding member is formed as a separate member different, from a member constituting the ceiling of the processing chamber and detachably fixed to the ceiling of the processing chamber.

* * * * *